(12) United States Patent
Cai

(10) Patent No.: US 10,346,565 B2
(45) Date of Patent: Jul. 9, 2019

(54) LUNAR BRIGHTNESS TEMPERATURE MODELING BASED ON THE MICROWAVE RADIOMETER DATA

(71) Applicant: Macau University of Science and Technology, Macau (CN)

(72) Inventor: Zhanchuan Cai, Macau (CN)

(73) Assignee: Macau University of Science and Technology, Macau (CN)

(\*) Notice: Subject to any disclaimer, the term of this patent is extended or adjusted under 35 U.S.C. 154(b) by 193 days.

(21) Appl. No.: 15/364,239

(22) Filed: Nov. 29, 2016

(65) Prior Publication Data

US 2018/0150574 A1 May 31, 2018

(51) Int. Cl.
*G06F 17/50* (2006.01)

(52) U.S. Cl.
CPC .................. *G06F 17/5009* (2013.01)

(58) Field of Classification Search
CPC .................................................. G06F 17/5009
USPC ............................................................. 703/6
See application file for complete search history.

(56) References Cited

PUBLICATIONS

"Lunar Brightness Temperature Model Based on the Microwave Radiometer Data of Chang'e-2" IEEE Transactions on Geoscience and Remote Sensing, vol. 55, No. 10, Oct. 2017 Zhanchuan Cai, Member, IEEE, and Ting Lan.*

K. Di, Y. Liu, B. Liu, M. Peng, W. Hu, A self-calibration bundle adjustment method for photogrammetric processing of Chang'E-2 stereo lunar imagery, IEEE Transactions on Geoscience and Remote Sensing 52 (9) (2014) 5432-5442. doi:10.1109/TGRS.2013.2288932.

B. Wu, J. Guo, Y. Zhang, B. A. King, Z. Li, Y. Chen, Integration of Chang'E-1 imagery and laser altimeter data for precision lunar topographic modeling, IEEE Transactions on Geoscience and Remote Sensing 49 (12) (2011) 4889-1903. doi:10.1109/TGRS.2011.2153206.

Y. Bu, W. Tang, W. Fa, C. Ding, G. Tang, Y. Yang, J. Cao, H. Chen, H. Yin, Relative trajectory estimation during Chang'E-2 probe's flyby of asteroid toutatis using dynamics, optical, and radio constraints, IEEE Transactions on Geoscience and Remote Sensing 54 (8) (2016) 4680-4693. doi:10.1109/TGRS.2016.2548713.

H. Ye, Y.-Q. Jin, Simulation of multiangular radar echoes for speed measurement during CE-3 landing on the lunar sinus iridum surface, IEEE Transactions on Geoscience and Remote Sensing 53 (9) (2015) 4922-4932. doi:10.1109/TGRS.2015.2413893.

J. Ma, F.-X. Le Dimet, Deblurring from highly incomplete measurements for remote sensing, IEEE Transactions on Geoscience and Remote Sensing 47 (3) (2009) 792-802. doi:10.1109/TGRS.20081004709.

(Continued)

*Primary Examiner* — Saif A Alhija
(74) *Attorney, Agent, or Firm* — Eagle IP Limited; Jacqueline C. Lui

(57) ABSTRACT

A computer system executes hierarchical MK splines approximation for lunar brightness temperature (TB) data approximation. The computer system constructs a TB model map by generating a final approximation function for constructing an interpolated surface that approximates the TB data set obtained by lunar probe. The method includes executing MK splines approximation to the TB data set with a hierarchy of control lattice from coarsest lattice to densest lattice to iteratively obtain approximation functions. The TB model map is constructed by generating a final approximation function to construct the interpolated surface.

13 Claims, 29 Drawing Sheets

(56) References Cited

PUBLICATIONS

Y.-Q. Jin, W. Fa, The modeling analysis of microwave emission from stratified media of nonuniform lunar cratered terrain surface for Chinese chang-e 1 observation, IEEE Geoscience and Remote Sensing Letters 7 (3) (2010) 530-534. doi:10.1109/LGRS.2010.2040802.

M. Montopoli, A. Di Carlofelice, P. Tognolatti, F. S. Marzano, Remote sensing of the moon's subsurface with multifrequency microwave radiometers: A numerical study, Radio Science 46 (1). doi:10.1029/2009RS004311.

Y. Lian, S.-B. Chen, Z.-G. Meng, Y. Zhang, P. Lu, Geological analysis of lunar middle and low latitude brightness temperature anomaly area based on Chang'E-2 MRM data, Acta Geoscientica Sinica 5 (2014) 018. doi:10.3975/cagsb.2014.05.15.

J.-Q. Feng, Y. Su, J.-J. Liu, L. Zeng, X. Tan, S. Dai, J.-D. Li, S.-G. Xing, Data processing and result analysis of CE-2 MRM, Editorial Committee of Earth Science—Journal of China University of Geosciences 4 (2013) 024. doi:10.3799/dqkx.2013.088.

A. Kontu, J. Pulliainen, Simulation of spaceborne microwave radiometer measurements of snow cover using in situ data and brightness temperature modeling, IEEE Transactions on Geoscience and Remote Sensing 48 (3) (2010) 1031-1044. doi:10.1109/IGARSS.2008.4780021.

M. Montopoli, A.-D. Carlofelice, M. Cicchinelli, P. Tognolatti, F.-S. Marzano, Lunar microwave brightness temperature: model interpretation and inversion of spaceborne multifrequency observations by a neural network approach, IEEE Transactions on Geoscience and Remote Sensing 49 (9) (2011) 3350-3358. doi:10.1109/TGRS.2011.2160351.

S.-J. Keihm, M.-G. Langseth, Lunar microwave brightness temperature observations reevaluated in the light of Apollo program findings, Icarus 24 (2) (1975) 211-230. doi:10.1016/0019-1035(75)90100-1.

S.-L. Lawson, B.-M. Jakosky, H.-S. Park, M.-T. Mellon, Brightness temperatures of the lunar surface: Calibration and global analysis of the clementine long-wave infrared camera data, Journal of Geophysical Research: Planets 105 (E2) (2000) 4273-4290. doi:10.1029/1999JE001047.

G.-P. Hu, Y.-C. Zheng, A.-A. Xu, Z.-S. Tang, Microwave brightness temperature of the moon: The possibility of setting a calibration source of the lunar surface, IEEE Geoscience and Remote Sensing Letters 13 (2) (2016) 182-186. doi:10.1109/LGRS.2015.2504543.

G.-P. Hu, Y.-C. Zheng, A.-A. Xu, Z.-S. Tang, Qualitative verification of CE-2's microwave measurement: Relative calibration based on brightness temperature model and data fusion, IEEE Transactions on Geoscience and Remote Sensing 54 (3) (2016) 1598-1609. doi:10.1109/TGRS.2015.2483782.

W.-Z. Fa, Y.-Q. Jin, Simulation of brightness temperature from lunar surface and inversion of regolith-layer thickness, Journal of Geophysical Research: Planets 112 (E5). doi:10.1029/2006JE002751.

Y.-C. Zheng, K.-T. Tsang, K-L. Chan, Y.-L. Zou, F. Zhang, Z.-Y. Ouyang, First microwave map of the moon with ChangE-1 data: The role of local time in global imaging, Icarus 219 (1) (2012) 194-210. doi:10.1016/j.icarus.2012.02.017.

W.-Z. Fa, Y.-Q. Jin, Analysis of microwave brightness temperature of lunar surface and inversion of regolith layer thickness: Primary results of chang-e 1 multi-channel radiometer observation, Science in China Series F: Information Sciences 53 (1) (2010) 168-181. doi:10.1007/s11432-010-0020-1.

K.L. Chan, K.-T. Tsang, B. Kong, Y.-C. Zheng, Lunar regolith thermal behavior revealed by Chang'E-1 microwave brightness temperature data, Earth and Planetary Science Letters 295 (1) (2010) 287-291. doi:10.1016/j.epsl.2010.04.015.

S.-G. Xing, Y. Su, J.-Q. Feng, C.-L. Li, The deconvolution of lunar brightness temperature based on the maximum entropy method using chang'e-2 microwave data, Research in Astronomy and Astrophysics 15 (2) (2015) 293-304. doi:10.1088/1674-4527/15/2/012.

W. Zuo, C.-L. Li, Z.-B. Zhang, Scientific data and their release of Chang'E-1 and Chang'E-2, Chinese Journal of Geochemistry 33 (1) (2014) 24-44. doi:10.1007/s11631-014-0657-3.

Y. Lian, S.-B. Chen, Z.-G. Meng, Y. Zhang, Distribution of microwave radiation brightness temperatures on the lunar surface based on Chang'E-2 MRM data, Geomatics and information science of wuhan university 40 (6) (2015) 732. doi:10.13203/j.whugis20120571.

Q. Dong-Xu, Matrix representation and estimation of remainder term of many-knot spline interpolating curves and surfaces, Computational Mathematics 4 (3) (1982) 244-252.

D.-X. Qi, H.-S Li, Many-knot spline technique for approximation of data, Science in China Series E: Technological Sciences 42 (4) (1999) 383-387. doi:10.1007/BF02916747.

P. Bornemann, F. Cirak, A subdivision-based implementation of the hierarchical b-spline finite element method, Computer Methods in Applied Mechanics and Engineering 253 (2013) 584-598. doi:10.1016/j.cma.2012.06.023.

B. Csebfalvi, An evaluation of prefiltered b-spline reconstruction for quasi-interpolation on the body-centered cubic lattice, IEEE Transactions on Visualization and Computer Graphics 16 (3) (2010) 499-512. doi:10.1109/TVCG.2009.87.

R.-Q. Wu, X.-R. Cheng, C.-J. Yang, Extracting contour lines from topographic maps based on cartography and graphics knowledge, Journal of Computer Science & Technology 9 (2) (2009) 58-64.

J. R. Sulebak, Ø. Hjelle, Multiresolution spline models and their applications in geomorphology, Concepts and Modelling in Geomorphology: International Perspectives (2003) 221-237.

H. Bao, K. Fueda, A method for topographical estimation of lake bottoms by B-Spline surface, American Journal of Theoretical and Applied Statistics 2 (4) (2013) 102-109. doi:10.11648/j.ajtas.20130204.12.

I. Juha'sz, A' . Ro'th, A class of generalized B-spline curves, Computer Aided Geometric Design 30 (1) (2013) 85-115. doi:101016/j.cagd.2012.06.007.

W. Ji, L. Di-hui, Z. Xiao-Hui, J. Jing-Shan, A. Altyntsev, B. Lubyshev, Microwave brightness temperature imaging and dielectric properties of lunar soil, Journal of earth system science 114 (6) (2005) 627-632. doi:10.1007/BF02715947.

X. Gong, D. A. Paige, M. A. Siegler, Y.-Q. Jin, Inversion of dielectric properties of the lunar regolith media with temperature profiles using Chang'E microwave radiometer observations, IEEE Geoscience and Remote Sensing Letters 12 (2) (2015) 384-388. doi:10.1109/LGRS.2014.2343617.

W. Zhang, N. Bowles, Chang'E-1 and Chang'E-2 lunar microwave radiometer data analysis and lunar subsurface temperature profile modelling, in: Lunar and Planetary Science Conference, vol. 44, 2013, p. 2025.

J.-Q. Feng, Y. Su, L. Zheng, J.-J. Liu, Lunar brightness temperature from microwave radiometers data of Chang'E-1 and Chang'E-2, in: EPSCDPS Joint Meeting 2011, vol. 1, 2011, p. 1838.

G.P. Hu, K. Chen, Q.-L. Huang, W. Guo, Q.-X. Li, L-Q. Gui, Y.-B. Cheng, Brightness temperature calculation of lunar crater: Interpretation of topographic effect on microwave data from Chang'E, IEEE Transactions on Geoscience and Remote Sensing 52 (8) (2014) 4499-4510. doi:10.1109/TGRS.2013.2282342.

G. M. Nielson, Scattered data modeling, IEEE Computer Graphics and Applications 13 (1) (1993) 60-70. doi:10.1109/38.180119.

S. Lee, G. Wolberg, S. Y. Shin, Scattered data interpolation with multilevel b-splines, IEEE transactions on visualization and computer graphics 3 (3) (1997) 228-244. doi:10.1109/2945.620490.

W. Fa, Y.-Q. Jin, Quantitative estimation of helium-3 spatial distribution in the lunar regolith layer, Icarus 190 (1) (2007) 15-23. doi:10.1016/j.icarus.2007.03.014.

* cited by examiner

TABLE I: The main indicators of microwave radiometer

110

| Frequency (GHz) | 3.0 | 7.8 | 19.35 | 37 |
|---|---|---|---|---|
| Bandwidth (MHz) | 100 | 200 | 500 | 500 |
| Integration time (ms) | 200 | 200 | 200 | 200 |
| Temperature resolution (K) | 0.5 | 0.5 | 0.5 | 0.5 |
| Linearity | 0.99 | 0.99 | 0.99 | 0.99 |
| Spatial resolution (km) | 50 | 35 | 35 | 5 |

Figure 1

Inversion process of lunar brightness temperature

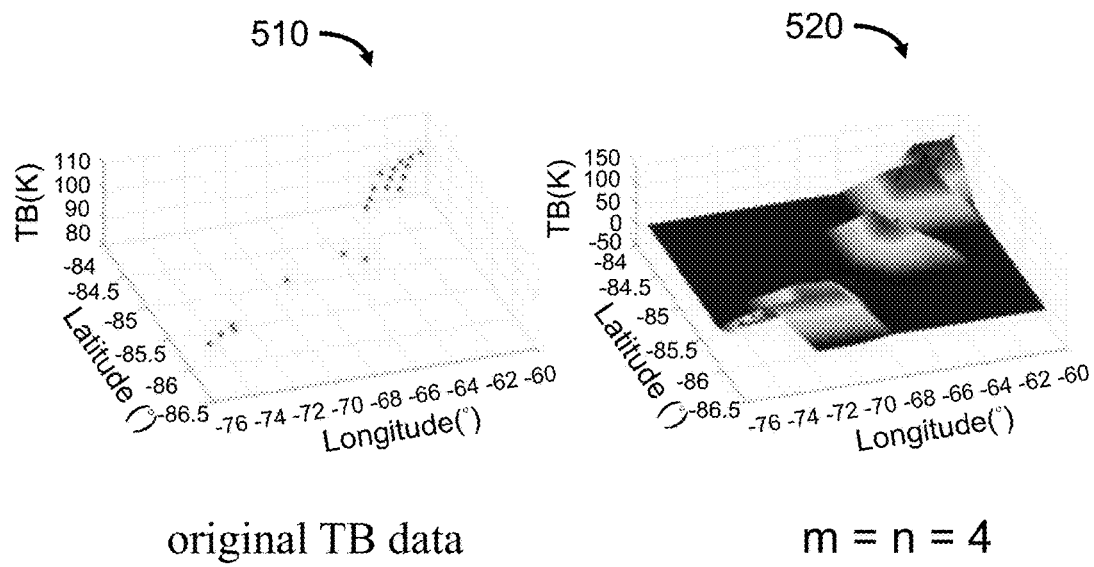
original TB data  
Figure 5A
m = n = 4  
Figure 5B
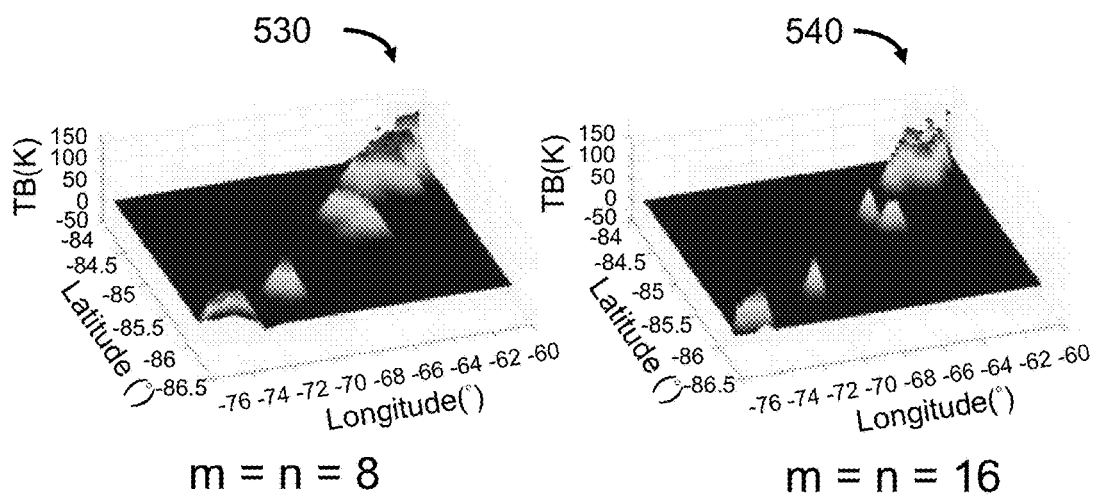
m = n = 8  
Figure 5C
m = n = 16  
Figure 5D

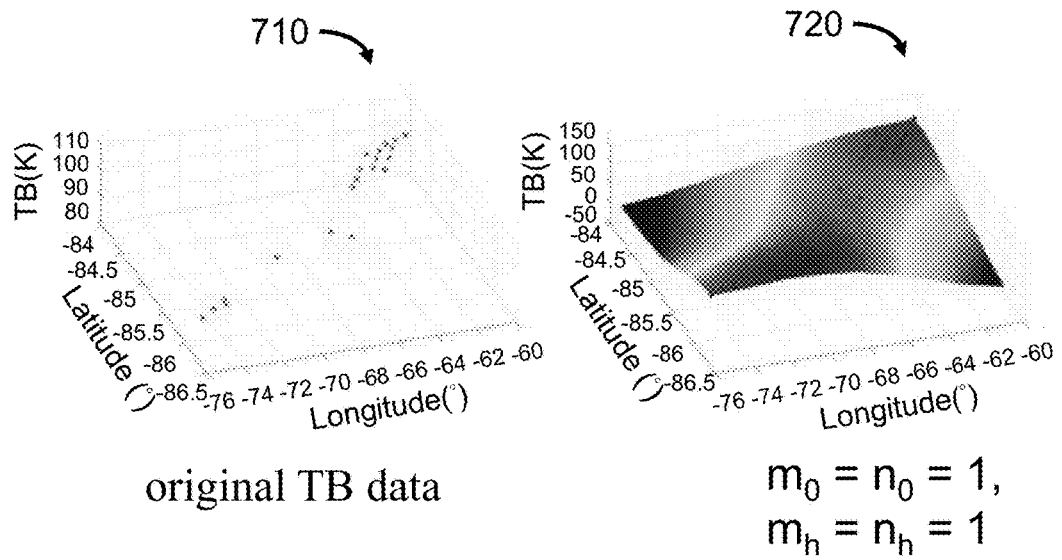
original TB data
$m_0 = n_0 = 1,$
$m_h = n_h = 1$
Figure 7A
Figure 7B
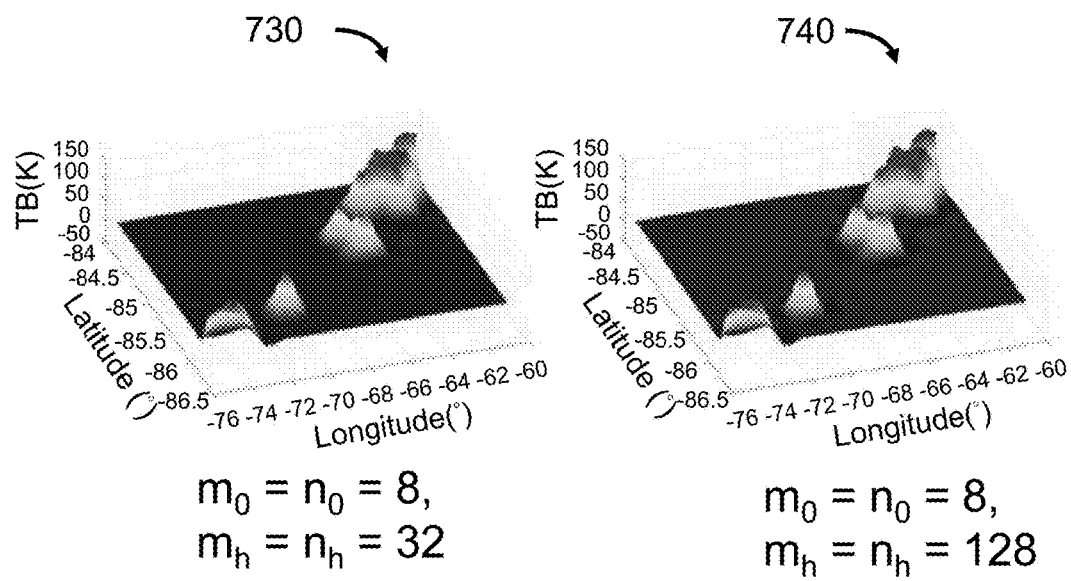
$m_0 = n_0 = 8,$
$m_h = n_h = 32$
$m_0 = n_0 = 8,$
$m_h = n_h = 128$
Figure 7C
Figure 7D

800

---
Algorithm 1: The Hierarchical MK splines
---
Input: TB data set $T = \{(x_{TB}, y_{TB}, z_{TB})\}$
Output: a control lattice hierarchy $C_0, C_1, \cdots, C_h$
let $k = 0$
while $k \leq h$ do
  let $T_k = \{(x_c, y_c, \Delta^k z_c)\}$
  compute $C_k$ from $T_k$ by Function MK splines $(T_k)$
  Function MK splines $(T_k)$
    for all $i, j$ do
      let $\delta_{ij} = 0$ and $\varpi_{ij} = 0$
      for each TB data point $(x_{TB}, y_{TB}, z_{TB})$ in $T_k$
      do
        let $i = \lfloor x_{TB} \rfloor$ and $j = \lfloor y_{TB} \rfloor$
        let $u = x_{TB} - \lfloor x_{TB} \rfloor$ and
        $v = y_{TB} - \lfloor y_{TB} \rfloor$
        compute $\omega_{pq}$ and $\sum_{a=-2}^{3} \sum_{b=-2}^{3} \omega_{ab}^2$
        for $p, q = -2, -1, 0, 1, 2, 3$ do
          compute $r_{pq}$
          add $\omega_{pq}^2 r_{pq}$ to $\delta_{(i+p)(j+q)}$
          add $\omega_{pq}^2$ to $\varpi_{(i+p)(j+q)}$
        end
      end
    end
    for all $i, j$ do
      if $\varpi_{ij} \neq 0$ then
        compute $c_{ij} = \delta_{ij}/\varpi_{ij}$
      else
        let $c_{ij} = 0$
      end
    end
    output control lattice $C_k = \{c_{ij}\}$
  end
  compute $\Delta^{k+1} z_c = \Delta^k z_c - f_k(x_c, y_c)$
  let $k = k + 1$
end

Figure 8

M-method

L-method

1010 → TABLE II: Nighttime

|  |  |  | 3.0 GHz | 7.8 GHz | 19.35 GHz | 37 GHz |
|---|---|---|---|---|---|---|
| M-method | M | MAE | 0.9279 | 0.9886 | 1.0257 | 1.1233 |
|  |  | RMS | 1.6751 | 1.7324 | 1.7432 | 1.9380 |
|  | B | MAE | 5.9184 | 5.7501 | 5.8690 | 5.5471 |
|  |  | RMS | 8.6110 | 8.4161 | 8.6809 | 8.2313 |
| L-method | M | MAE | 0.8869 | 0.9664 | 1.0875 | 1.1000 |
|  |  | RMS | 1.5010 | 1.7418 | 1.8387 | 1.8106 |
|  | B | MAE | 5.8727 | 6.2083 | 6.0404 | 5.6609 |
|  |  | RMS | 8.4310 | 8.8174 | 8.6885 | 8.0630 |

M: hierarchical MK splines approximation
B: Multilevel B-splines function method

Figure 10A

1020 → TABLE III: Daytime

|  |  |  | 3.0 GHz | 7.8 GHz | 19.35 GHz | 37 GHz |
|---|---|---|---|---|---|---|
| M-method | M | MAE | 0.9453 | 1.0299 | 1.1602 | 1.3016 |
|  |  | RMS | 1.7291 | 1.7491 | 1.9775 | 2.1902 |
|  | B | MAE | 5.8999 | 5.7726 | 6.7719 | 7.1734 |
|  |  | RMS | 8.7210 | 8.4610 | 9.7691 | 10.5132 |
| L-method | M | MAE | 0.9688 | 1.0751 | 1.1449 | 1.3423 |
|  |  | RMS | 1.7777 | 1.8640 | 1.9148 | 2.4095 |
|  | B | MAE | 6.1272 | 6.0787 | 6.8456 | 7.5062 |
|  |  | RMS | 8.9208 | 8.8723 | 10.0279 | 10.9373 |

M: hierarchical MK splines approximation
B: Multilevel B-splines function method

Figure 10B

TB modeling data at 1 o'clock (7.8 GHz)

Lunar north pole TB modeling at 1 o'clock (7.8 GHz)   Lunar south pole TB modeling at 1 o'clock (7.8 GHz)

1510

TB modeling data at 13 o'clock (3.0 GHz)

1520   1530

Lunar north pole TB modeling at 13 o'clock (3.0 GHz)   Lunar south pole TB modeling at 13 o'clock (3.0 GHz)

TB modeling data at 13 o'clock (19.35 GHz)

Lunar north pole TB modeling at 13 o'clock (19.35 GHz)

Lunar south pole TB modeling at 13 o'clock (19.35 GHz)

TB curve (Longitude: 175.5°W)
13 o'clock

TB curve (Longitude: 12.5°S)
1 o'clock

TB curve (Longitude:12.5°S)
13 o'clock

TB modeling at 1 o'clock (37GHz)

1 o'clock   13 o'clock
Comparison Map (Area 'C')

1 o'clock   13 o'clock
Comparison Map (Area 'D')

LUNAR BRIGHTNESS TEMPERATURE MODELING BASED ON THE MICROWAVE RADIOMETER DATA

FIELD OF THE INVENTION

The invention is directed to a computer system that executes hierarchical many-knot (MK) splines scheme for lunar brightness temperature (TB) data modeling.

BACKGROUND

The microwave radiometer (MRM) onboard lunar probe is mainly used to obtain the brightness temperature (TB) data of the lunar surface. High resolution TB maps are necessary for research because there is a close relationship between the TB data and some related physical properties of lunar regolith, such as thickness, dielectric constant and other properties of the lunar regolith. To analyze the lunar TB data obtained at different times and different frequencies, as well as the TB maps in the history, a method for constructing or reconstructing TB model maps of the entire lunar surface in high resolution will assist in advancing technological needs and solving technological problems.

SUMMARY OF THE INVENTION

One example embodiment is a computer system that executes hierarchical many-knot (MK) splines approximation for constructing TB model map.

In one example embodiment, the computer system executes a method that constructs a TB model map by generating a final approximation function f that approximates a TB data set T. The method includes setting a hierarchy of control lattice from coarsest to densest $C_0$, $C_1, \ldots, C_h$; executing MK splines approximation to T with the coarsest control lattice $C_0$ to obtain approximation function $f_0$ that is the most smooth approximation function of T; calculating a first deviation $\Delta^1 z_{TB}$ of $f_0$ for each point in T to generate a deviation data set $T_1$; performing iteration steps for the control lattices from $C_1$ to $C_h$ to generate a sequence of approximation functions from $f_1$ to $f_h$, the iteration steps include: for a level k of the hierarchy of control lattice, summing $f_0$ to $f_{k-1}$ to yield a smaller deviation $\Delta^k z_{TB}$ for each point in T to generate a deviation data set $T_k$ and executing the MK splines approximation with the control lattice $C_k$ to the deviation data set $T_k$ to obtain approximation function $f_k$; generating the final approximation function f by summing $f_0$ to $f_h$ to construct an interpolated surface; constructing the TB model map from the interpolated surface.

Other example embodiments are discussed herein.

BRIEF DESCRIPTION OF THE DRAWINGS

FIG. 1 shows a table which provides the main performance indicators of microwave radiometer in accordance with an example embodiment.

FIG. 5A shows original TB data set in accordance with an example embodiment.

FIG. 5B shows a graph depicting approximation function f derived by the MK splines approximation for m=n=4 in accordance with an example embodiment.

FIG. 5C shows a graph depicting approximation function f derived by the MK splines approximation for m=n=8 in accordance with an example embodiment.

FIG. 5D shows a graph depicting approximation function f derived by the MK splines approximation for m=n=16 in accordance with an example embodiment.

FIG. 7A shows an original TB data set in accordance with an example embodiment.

FIG. 7B shows a graph depicting approximation function f derived by the hierarchical MK splines approximation for $m_0=n_0=1$ and $m_h=n_h=1$ in accordance with an example embodiment.

FIG. 7C shows a graph depicting approximation function f derived by the hierarchical MK splines approximation for $m_0=n_0=8$ and $m_h=n_h=32$ in accordance with an example embodiment.

FIG. 7D shows a graph depicts approximation function f derived by the hierarchical MK splines approximation for $m_0=n_0=8$ and $m_h=n_h=128$ in accordance with an example embodiment.

FIG. 8 shows a pseudo code that outlines the basic algorithm for the hierarchical MK splines approximation in accordance with an example embodiment.

FIG. 10A shows a table which provides the result of modeling accuracy of the hierarchical MK splines approximation (M) and the multilevel B-splines function method (B) measured by the root mean squared error (RMSE) and the mean absolute error (MAE) for TB data sampled by M-method and L-method and obtained by lunar probe at nighttime with working frequencies 3.0 GHz, 7.8 GHz, 19.35 GHz and 37 GHz in accordance with an example embodiment.

FIG. 10B shows a table which provides the result of modeling accuracy of the hierarchical MK splines approximation (M) and the multilevel B-splines function method (B) measured by the root mean squared error (RMSE) and the mean absolute error (MAE) for TB data sampled by M-method and L-method and obtained by lunar probe at daytime with working frequencies 3.0 GHz, 7.8 GHz, 19.35 GHz and 37 GHz in accordance with an example embodiment.

DETAILED DESCRIPTION

Figure 2:
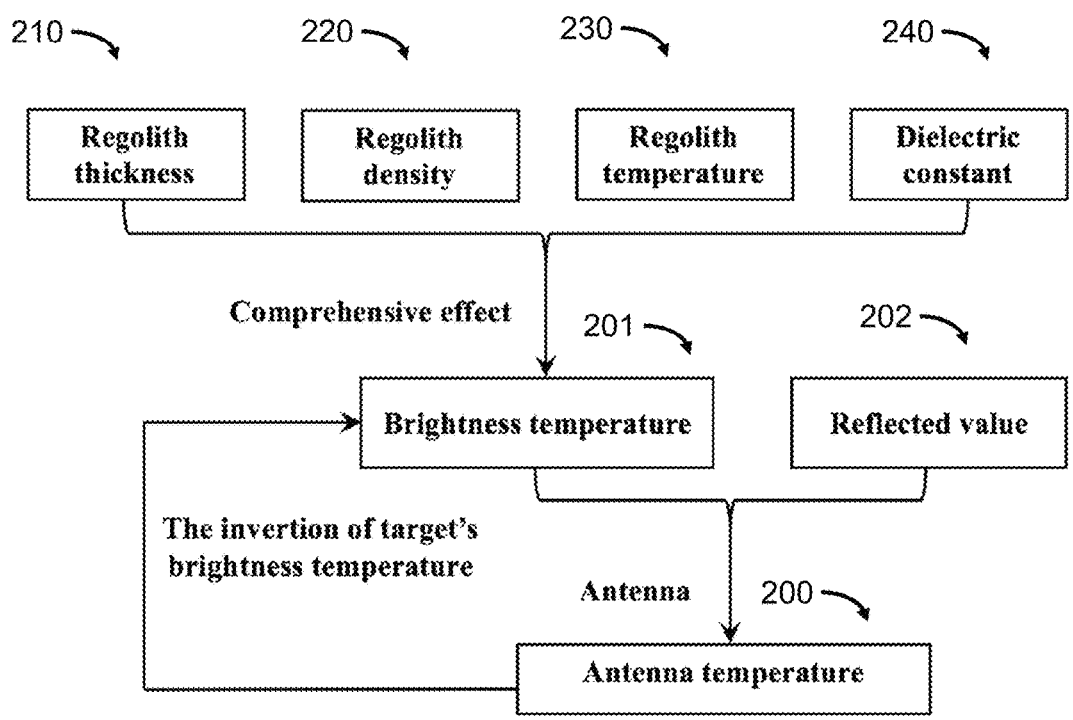
FIG. 2 shows an inversion process of lunar brightness temperature in accordance with an example embodiment.

Examples embodiments relate to apparatus and methods that construct or reconstruct a brightness temperature (TB) model map of an object or surface of an object by applying MK splines function with a hierarchy of control lattice for a TB data set T or a TB data set T of a TB map. Example embodiments generate a high resolution TB model map of the object.

For illustration purposes, example embodiments are discussed with the object being the moon or a surface of the object being a lunar surface. Example embodiments are not limited to the moon and its surface but can be applied to other physical objects and their surfaces as well, such as the Earth and planets.

An example embodiment includes a method executed by a computer system to construct a TB model map of a lunar surface by generating a sequence of approximation functions. A sum of these functions approaches a desired interpolated surface that approximates a TB data set T of the lunar surface obtained by a lunar probe based on applying an MK splines function with a hierarchy of control lattice from coarsest to densest $C_0, C_1, \ldots, C_h$. In the sequence, an approximation function from the coarsest control lattice provides an initial estimate, which is further refined in accuracy by approximation functions derived at finer levels.

In one example embodiment, a computer system includes at least one processor coupled to and/or in communication with a non-transitory computer-readable medium having stored therein instructions that when executed cause the at least one processor to receive a TB data set T of a TB map of the lunar surface obtained by a lunar probe. The processor further executes the instructions to set a hierarchy of control lattice from coarsest to densest $C_0, C_1, \ldots, C_h$, to generate a sequence of approximation function whose sum approaches desired interpolated surface that approximates T based on applying MK splines function with the hierarchy of control lattice, and to display a TB model map of the lunar surface constructed from the interpolated surface on a display.

China first lunar probe Chang'E-1 (CE-1) was successfully launched on 24 Oct. 2007 from Xichang Satellite Launch Center, and controlled to impact on the lunar surface on 1 Mar. 2009. The lunar probe Chang'E-2 (CE-2) was successfully launched and successfully entered the earth-moon transfer orbit on 1 Oct. 2010. During the operation period, the CE-2 obtained a large number of valid scientific data. The CE-2 brought the new data set for the lunar science, space science, research and application of lunar resources, etc. To enhance human understanding and research level of space, the origin of the Moon and universe, it is the milestones in lunar exploration activities.

Lunar brightness temperature (TB) has important scientific value for the study of the physical properties of lunar regolith, such as thickness, dielectric constant and other properties of the lunar regolith. The lunar probe CE-2 is equipped with passive microwave radiometer (MRM) to detect the brightness temperature of the lunar surface, and can retrieve the global distribution of lunar regolith thickness. The MRM is one of the major load which is equipped on the Chang'E satellite. The MRM has four frequencies working at frequencies of 3.0 GHz, 7.8 GHz, 19.35 GHz and 37 GHz. Typically, lower frequencies have deeper penetration. Different frequencies indicate different detected depths. While the frequency increases, then probing depth decreases, and different thicknesses of lunar regolith are reflected. Different lunar regolith thicknesses have different parameters of physical property, such as temperature, dielectric constant, density, thermal conductivity and specific heat. When they reflect to microwave radiation transport model, they are different layers with emissivity, transmittance and physical temperature.

FIG. 1 shows Table 110 which provides the main performance indicators of microwave radiometer. The TB data are the important data source to study the physical properties of the lunar surface, and it quantifies the intensity of the microwave radiation of the Moon. The MRM data based on the Chang'E satellite can probe the Moon. Research of the lunar microwave TB distribution data has important values for the scientific research of the Moon.

One embodiment uses the CE-2 MRM data to construct a TB model map of the whole Moon in different resolutions by hierarchical MK splines approximation. Unlike the classic B-splines approximation, the hierarchical MK splines approximation has locality and can obtain desired TB model maps. The B-splines approximation is classic and widely used in topographical analysis. However, in the case of the TB data points based on regular grid, the B-splines cannot achieve the desired TB modeling without solving systems of equations.

For a medium of uniform temperature and uniform dielectric constant, the brightness temperature (TB) is defined as the product of emissivity of the medium and physical temperature of the medium. From the output voltage of the CE-2's MRM, the TB data of the Moon can be inverted.

FIG. 2 shows the inversion process of lunar TB. Through the conversion of the establish standard of equation, the antenna temperature 200 of the Moon can be obtained from the measurable output of MRM. The antenna temperature 200 is an integral, the apparent temperature distribution uses antenna pattern weighted to produce this integral. By solving this integral equation, the apparent temperature of the Moon from the antenna temperature 200 can be obtained. This process is called as the inversion or recovery of the apparent temperature. When excluding impact of the universe, the galactic clusters and other factors, then the TB 201 of the Moon's own radiation can be obtained. The TB 201 of lunar surface indicates the emission characteristics of lunar surface material (regolith), it is the comprehensive effect of regolith thickness 210, density 220, temperature 230, dielectric constant 240, etc.

After in-orbit flight, 2401 tracks of the TB data are obtained by MRM of lunar probe CE-2, and the TB data cover the whole Moon over seven times to produce a TB map. Although the obtained microwave TB data of CE-2's MRM cover the entire lunar surface several times, the TB map can only use the data at different times to fill certainly resolution of the lunar surface grid. The local time is different for each sampling location of lunar surface. For a particular place, there are more sampling TB data in a certain period of time, and less in another period of time. Also, for some period of time, there is no sampled TB data. In other words, TB data at the same time from the measured TB data cannot be directly chosen to cover the entire lunar surface. Thus, sampled TB data in other period of time is used to obtain the TB data of certain periods of time. Firstly, 2401 tracks of the TB data are quantized to each hour in a day (24-hour clock). Then, microwave TB data at two adjacent time are selected to fill microwave TB data of the current time, i.e. each data in a TB data set T of the TB map of the lunar surface is obtained by a lunar probe detected at time intervals of one hour. The hierarchical MK splines approximation is applied and the TB model map of the entire lunar surface at the current time is obtained.

In order to construct a high resolution TB model map of the entire lunar surface with different times and frequencies, the desired TB modeling is derived by using the hierarchical MK splines approximation. The evaluation formula and detailed derivation of the MK splines are presented. The MK splines of order k has the following form $$L_K(M) = \Sigma b_i \mu^{h_i} \Omega_k(B)$$

where $b_i (i=0, 1, \ldots, k-1)$ is undetermined constants.

$$h_0 = 0, 0 < h_1 < h_2 < \ldots < h_{k-1} < \frac{k-1}{2}\mu$$

is an average operator and satisfies the following functional equation.

$$\mu^\xi f(x) \equiv [f(x+\xi) + f(x-\xi)]$$

where $\xi$ is the given constant.

$\Omega_k(B)$ is the B-splines basis function of order k and has the following form $$\Omega_k(B) = \overline{\Delta} \int_{-\infty}^{B} \Omega_{k-1}(B) dB = \overline{\Delta}^{k+1} B_+^k = \frac{1}{k!} \sum_{j=0}^{k+1} (-1)^j \binom{k+1}{j} \left(B + \frac{k+1}{2} - j\right)_+^k$$

where $k=0, 1, 2, 3, \ldots$ $(\bullet)_+ = \max\{\bullet, 0\}$.

Clearly, the following equations can be obtained $$L_0(M) = \Omega_0(B)$$

$$L_1(M) = \Omega_1(B)$$

When k=2, let $$h_0 = 0, h_1 = \frac{1}{2}, L_2(M)$$

can be obtained $$L_2(M) = \left(2I - \mu^{\frac{1}{2}}\right)\Omega_2(B), k = 2$$

When k>1, in order to compute $L_k(M)$, let $L_k(0)=1$, $L_k(1)=0$, $m \neq 0$, where i is a non-zero integer, then the linear equations for $a_i (i=0, 1, \ldots, k-1)$ can be obtained. $L_k(M)$ can be obtained by solving the linear equations and the obtained $L_k(M)$ is the MK splines basis function of order k.

Figure 3A:
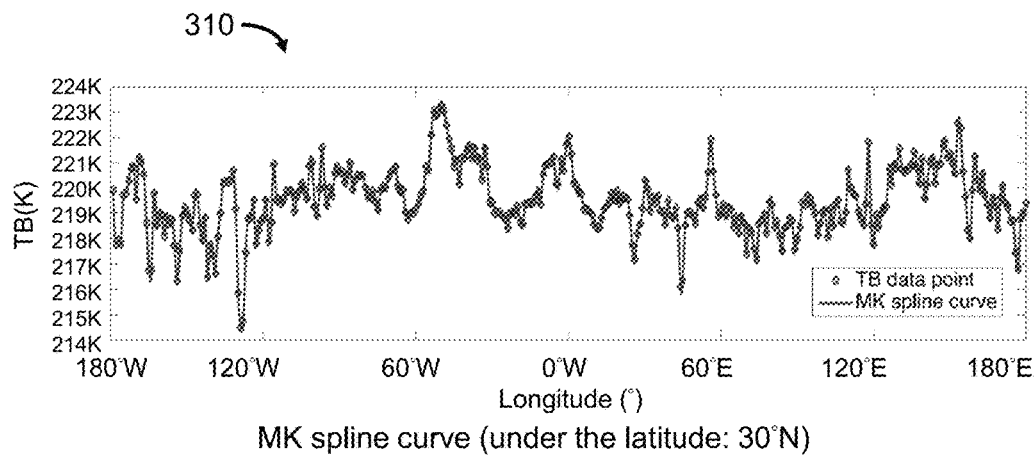
FIG. 3A shows a graph illustrating the TB (K) of MK spline curve and TB (K) of data point varies with the longitude under the latitude 30° N in accordance with an example embodiment.
Figure 3B:
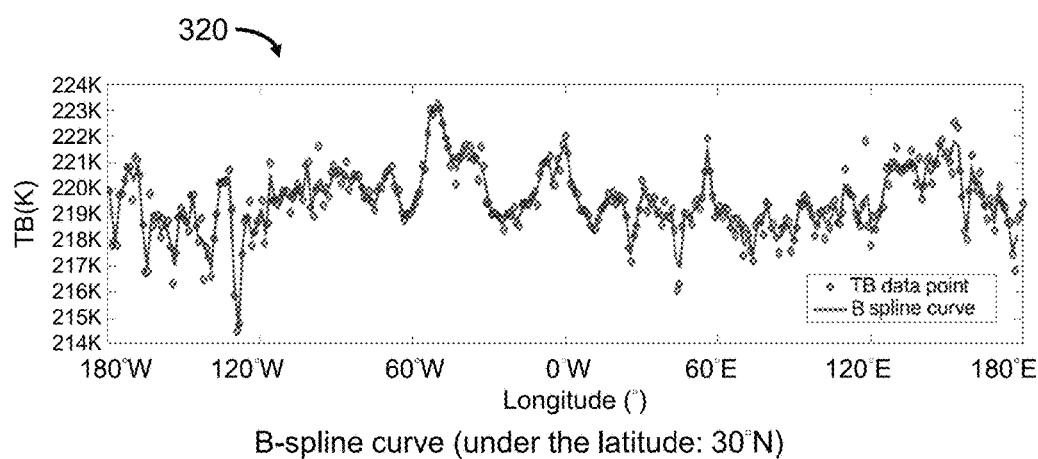
FIG. 3B shows a graph illustrating the TB (K) of B spline curve and TB (K) of data point varies with the longitude under the latitude 30° N in accordance with an example embodiment.
Figure 4A:
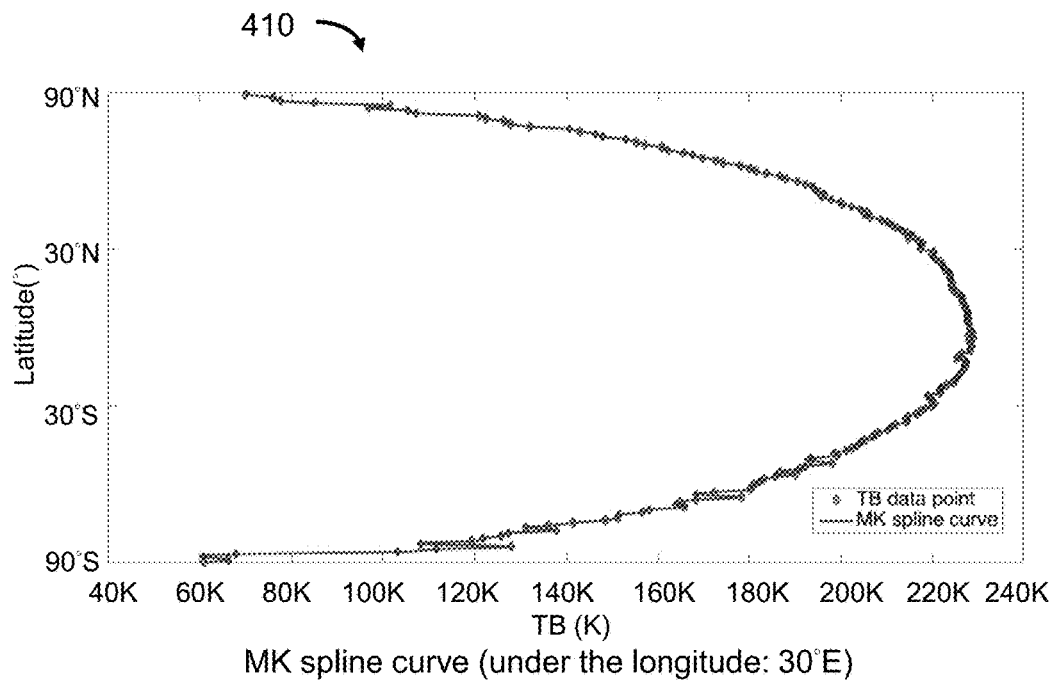
FIG. 4A shows a graph illustrating the TB (K) of MK spline curve and TB (K) of data point varies with the latitude under the longitude 30° E in accordance with an example embodiment.
Figure 4B:
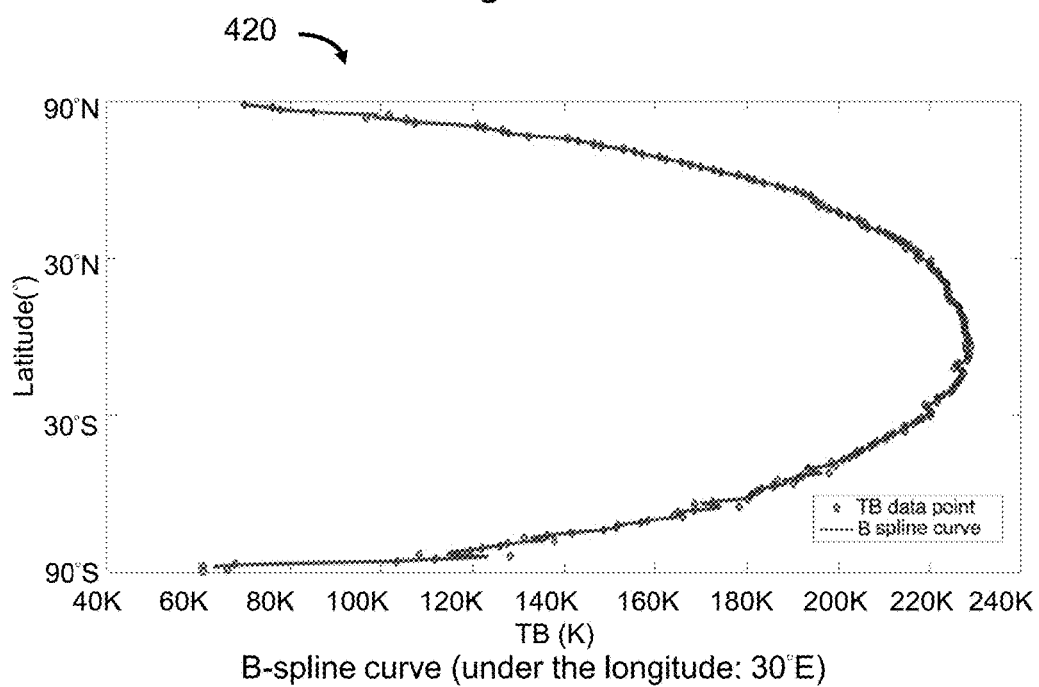
FIG. 4B shows a graph illustrating the TB (K) of B spline curve and TB (K) of data point varies with the with the latitude under the longitude 30° E in accordance with an example embodiment.

In fact, the MK splines basis function is explicit while the B-splines basis function is inexplicit for regularly sampling TB data. For the TB data points based on regular grid, even though both the B-splines curve and the MK splines curve have locality, but the MK splines curve can pass through each TB data point without solving systems of equations, while the B-splines curve cannot, as are shown in graphs 310, 320, 410, 420 in FIGS. 3A, 3B, 4A and 4B respectively. From FIGS. 3A and 3B, it can also be found that the MK spline curve and the B-spline curve vary with longitude at latitude: 30° N. In FIGS. 4A and 4B, the MK spline curve and the B-spline curve vary with latitude at longitude: 30° E. These microwave TB data points are obtained from the nighttime TB map (3.0 GHz) with resolution of 1°×1° from CE-1.

In one embodiment, in the construction process of the entire lunar TB model map, two adjacent time of the TB data are considered as the current time of the TB data, i.e. each data in a TB data set T of the TB map of the lunar surface is obtained by a lunar probe detected at time intervals of one hour. The parameter x is used to represent longitude, the parameter y is used to represent latitude, the TB data set is represented as $T=\{x_{TB}, y_{TB}, z_{TB}\}$, where $-m_1 \le x_{TB} \le m_2$, $-n_1 \le y_{TB} \le n_2$, $0 < m < 180$, $0 < n < 90$, $0 \le m_1 \ne m_2 \le m$, $0 \le n_1 \ne n_2 \le n$, $z_{TB}$ represents the TB data value at longitude: $x_{TB}$, latitude: $y_{TB}$.

The MK splines function is represented as the TB approximation function f and the control lattice C defines it. C is considered as a lattice with the size of (m+5)×(n+5). The TB approximation function f can be defined as follows when the value of the ij-th control point on lattice C is $C_{ij}$.

$$f(x_{TB}, y_{TB}) = \sum_{p=-2}^{3} \sum_{q=-2}^{3} L_3(u-p) L_3(v-q) \times c_{(i+p)(j-q)}$$

where $i=[x_{TB}]$, $j=[y_{TB}]$, $u=x_{TB}-[x_{TB}]$ and $v=y_{TB}-[y_{TB}]$, $L_3(M)$ is the cubic MK splines basis function as shown in following.

$$L_3(M) = \begin{cases} 1 - \frac{5}{2}|M|^2 + \frac{14}{9}|M|^3 & 0 \le |M| < \frac{1}{2} \\ \frac{19}{18} - \frac{1}{3}|M| - \frac{11}{6}|M|^2 + \frac{10}{9}|M|^3 & \frac{1}{2} \le |M| < 1 \\ \frac{37}{12} - \frac{77}{12}|M| + \frac{17}{4}|M|^2 - \frac{11}{12}|M|^3 & 1 \le |M| < \frac{3}{2} \\ \frac{5}{6} - \frac{23}{12}|M| + \frac{5}{4}|M|^2 - \frac{1}{4}|M|^3 & \frac{3}{2} \le |M| < 2 \\ -\frac{49}{18} + \frac{41}{12}|M| - \frac{17}{12}|M|^2 + \frac{7}{36}|M|^3 & 2 \le |M| < \frac{5}{2} \\ \frac{3}{4} - \frac{3}{4}|M| + \frac{1}{4}|M|^2 - \frac{1}{36}|M|^3 & \frac{5}{2} \le |M| < 3 \\ 0 & 3 \le |M| \end{cases} \quad (1)$$

Let the value of the TB approximation function f at $(x_{TB}, y_{TB})$ is $c_{pq}$, (p, q=−2, −1, 0, 1, 2, 3), for each TB data point, $f(x_{TB}, y_{TB})=z_{TB}$, $c_{pq}$ must satisfy:

$$z_{TB} = \sum_{p=-2}^{3} \sum_{q=-2}^{3} \omega_{pq} c_{pq}$$

where $\omega_{pq} = L_3(u-p) L_3(v-q)$, $c_{pq}$ has the form as follows $$c_{pq} = \frac{\omega_{pq} z_{TB}}{\sum_{a=-2}^{3} \sum_{b=-2}^{3} \omega_{ab}^2} \quad (2)$$

For each TB data point, a set of 6×6 control points in its neighborhood should be determined by formula (1). In order to resolve multiple assignments to control point C, the TB data points in its 6×6 neighborhood should be considered, and then multiple assignments are resolved by control point C, only these TB points may influence the value of C by formula (2). This set of TB data points is considered as the proximity data set of C. Let $T_{ij}$ be the proximity data set of control point $C_{ij}$ and $T_{ij}=\{x_{TB}, y_{TB}, z_{TB}\} \in T | i-2 \le x_{TB} < i+3$, $j-2 \le y_{TB} < j+3$. For each TB point $\{x_{TB}, y_{TB}, z_{TB}\}$ in $T_{ij}$, $C_{ij}$ has different values $C_{TB}$ by formula (2).

$$c_{TB} = \frac{\omega_{TB} z_{TB}}{\sum_{a=-2}^{3} \sum_{b=-2}^{3} \omega_{ab}^2}$$

where $\omega_{TB} = \omega_{pq} = L_3(u-p) L_3(v-q)$, $p=i-[x_{TB}]$, $q=j-[y_{TB}]$, $u=x_{TB}-[x_{TB}]$ and $v=y_{TB}-[y_{TB}]$.

In order to tradeoff among the value, $C_{ij}$ is chosen to minimize error: $e(c_{ij}) = \sum_c (\omega_{TB} c_{ij} - \omega_{TB} c_{TB})^2$. The $(\omega_{TB} c_{ij} - \omega_{TB} c_{TB})$ is the difference between the real contribution and expected contribution of $C_{ij}$ to the TB approximation function f at $(x_{TB}, y_{TB})$. By differentiating the error $e(c_{ij})$ with respect to $c_{ij}$, the following formula is obtained.

$$c_{ij} = \frac{\sum_c \omega_{TB}^2 c_{TB}}{\sum_{TB} \omega_{TB}^2}$$

When the control point has an empty proximity TB data set, zero is assigned to the control point.

The density of control lattice C directly affects the shape of the TB approximation function f. When C becomes coarser, the proximity TB data set of each control point cover a larger number of TB data points in T. Then, many TB data points blend together to yield a smoother shape for the TB approximation function f. However, when C becomes finer, the influence of a TB data point is limited to smaller neighborhoods. Then, T is more closely approximated, although the TB approximation function f tends to contain local peaks near the TB data point.

FIG. 5A shows original TB data set T 510. FIGS. 5B, 5C and 5D show graphs 520, 530 and 540 depicting approximation function f derived by the MK splines approximation with m=n=4, m=n=8 and m=n=16, respectively. Coarser control points generate smoother shape function but derivate a larger deviation of the TB data set T. When C becomes finer, the TB data set T can be more closely approximated, but the TB approximation function f tends to contain local peaks near the TB data point.

Figure 6:
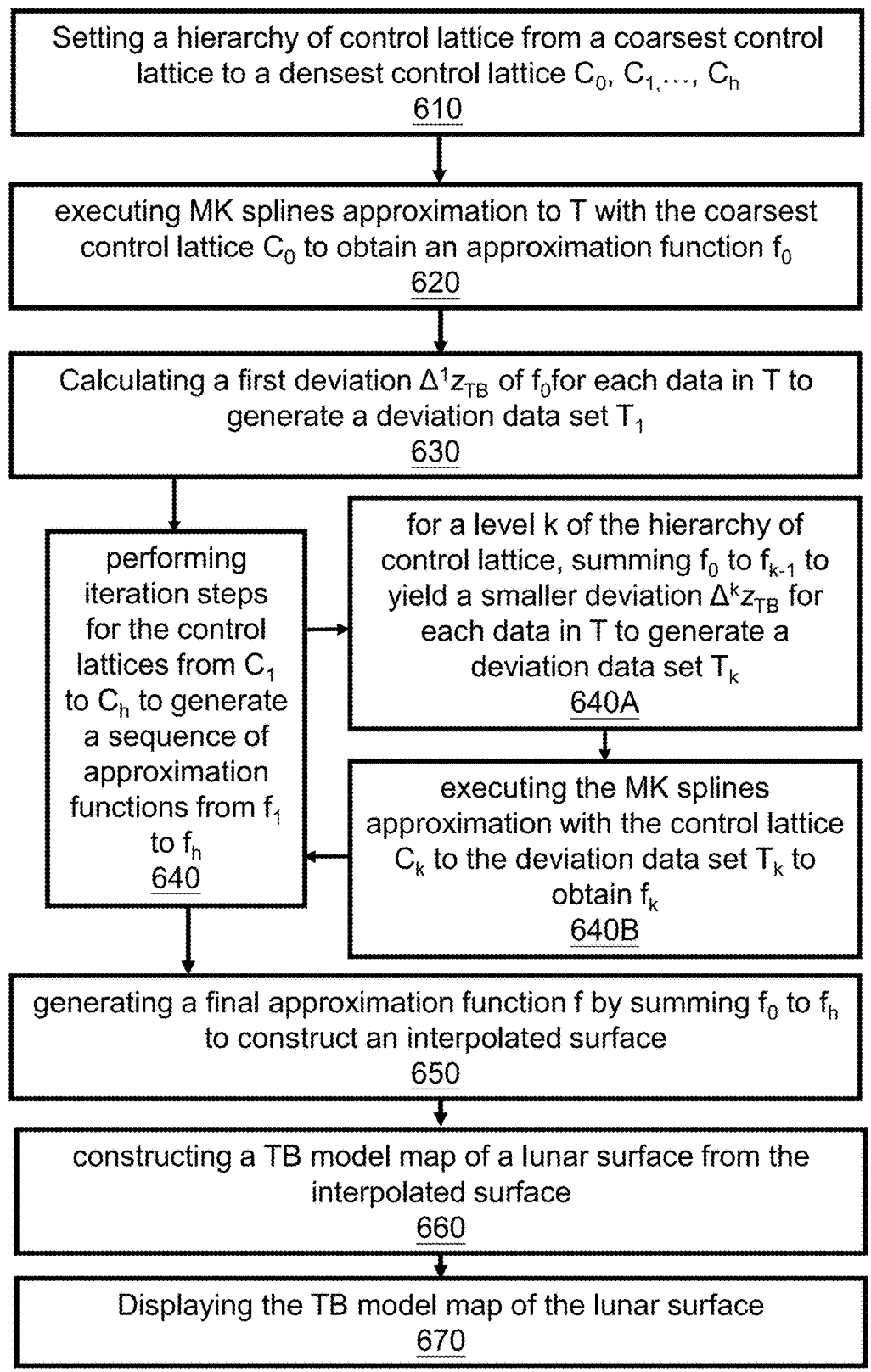
FIG. 6 shows a method executed by computer system to construct and display a TB model map using hierarchical MK splines approximation for a TB data set T in accordance with an example embodiment.

An example embodiment circumvents this tradeoff by generating a final approximation function f from a sequence of approximation functions whose sum approaches the desired approximate function and simultaneously achieves a smooth shape while closely approximates the TB data set T. In the sequence of approximation functions, the function from the coarsest lattice provides a rough approximation, which is further refined in accuracy by the functions derived from finer lattices. FIG. 6 shows a method executed by computer system to construct a TB model map of a lunar surface from a TB data set T of the lunar surface using hierarchical MK splines approximation. The hierarchical MK splines approximation generates the final approximation function f that approximates T.

Block 610 illustrates setting a hierarchy of control lattice $C_0, C_1, \ldots, C_h$, wherein $C_0$ is a coarsest control lattice and $C_h$ is a densest control lattice, $C_k$ is the control lattice at a level k of the hierarchy of control lattice, a spacing between control points in the control lattice is smaller from one lattice to a next lattice.

By way of example, the spacing between control points for $C_0$ is given and that the spacing between control points in the control lattice is halved from one lattice to the next lattice of the hierarchy of control lattice. Therefore, when $C_k$ is a (m+5)×(n+5) lattice, $C_{k+1}$ has (2m+5)×(2n+5) control points.

Block 620 illustrates executing, by the computer system, MK splines approximation to the TB data set T with the coarsest control lattice $C_0$ to obtain approximation function $f_0$. The function $f_0$ is the most smooth approximation function but also leaves large discrepancies at the data points in T.

Block 630 illustrates calculating, by the computer system, a first deviation $\Delta^1 z_{TB} = z_{TB} - f_0(x_{TB}, y_{TB})$ of $f_0$ for each TB data point $(x_{TB}, y_{TB}, z_{TB})$ in T to generate a deviation data set $T_1 = \{(x_{TB}, y_{TB}, \Delta^1 z_{TB})\}$ which is used as the TB data set for the next finer control lattice $C_1$ to obtain the TB approximation function $f_1$.

Then, the sum $f_0 + f_1$ yields a smaller deviation $\Delta^2 z_{TB} = z_{TB} - f_0(x_{TB}, y_{TB}) - f_1(x_{TB}, y_{TB})$ for each TB data point $(x_{TB}, y_{TB}, z_{TB})$ in T.

Block 640 illustrates performing, by the computer system, iteration steps of the processes illustrated in Block 640A and Block 640B from the control lattice $C_1$ and continues incrementally to the finest lattice $C_h$ to generate a sequence of approximation function from $f_1$ to $f_h$.

Block 640A illustrates, for the level k in the hierarchy of control lattice, summing, by the computer system, $f_0$ to $f_{k-1}$ to yield a smaller deviation $\Delta^k z_{TB} = z_{TB} - \Sigma_{i=0}^{k-1} f_i(x_{TB}, y_{TB}) = \Delta^{k-1} z_{TB} - f_{k-1}(x_{TB}, y_{TB})$ for each data point in T to generate a deviation data set $T_k = \{(x_{TB}, y_{TB}, \Delta^k z_{TB})\}$, where $\Delta^0 z_{TB} = z_{TB}$.

Block 640B illustrates executing, by the computer system, the MK splines approximation with the control lattice $C_k$ to the deviation data set $T_k$ to obtain an approximation function $f_k$.

Block 650 illustrates generating, by the computer system, the final approximation function f by summing $f_0$ to $f_h$ to construct an interpolated surface. Only the coarsest lattice $C_0$ is applied to the original data T to derive the global shape of function f. All successively finer lattices serve to approximation and remove the residual error. In this manner, an incremental solution for function f yields a smooth and close approximation to T.

Block 660 illustrates constructing, by the computer system, the TB model map of a lunar surface from the interpolated surface.

Block 670 illustrates displaying, by the computer system, the TB model map of the lunar surface.

One example embodiment is applied to original TB data 710 as shown in FIG. 7A, which is the same as the original data 510 as shown in FIG. 5A, both of them contain 20 TB data points. Let $(m_h+5) \times (n_h+5)$ be the size of the finest control lattice $C_h$. FIG. 7B shows graph 720 depicts approximation function f derived by the hierarchical MK splines approximation for $m_0 = n_0 = 1$ and $m_h = n_h = 1$ in one example embodiment. FIG. 7C shows graph 730 depicts approximation function f derived by the hierarchical MK splines approximation for $m_0 = n_0 = 8$ and $m_h = n_h = 32$ in one example embodiment. FIG. 7D shows graph 740 depicts approximation function f derived by the hierarchical MK splines approximation for $m_0 = n_0 = 8$ and $m_h = n_h = 128$ in one example embodiment. These example embodiments are shown to generate a much smoother and more accurate function than using the MK splines approximation.

FIG. 8 shows the pseudo code 800 that outlines the algorithm for the hierarchical MK splines approximation for constructing a TB model map in accordance with an example embodiment.

Figure 9A:
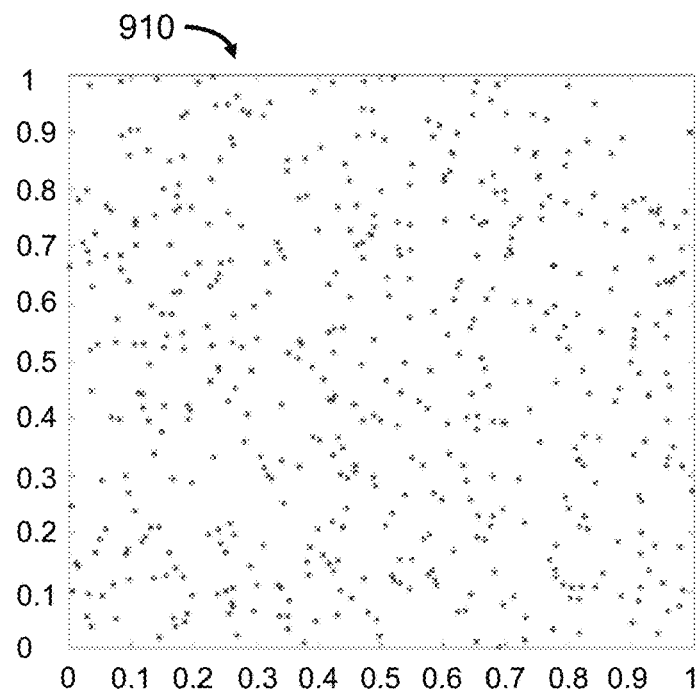
FIG. 9A shows data points sampled by M-method in accordance with an example embodiment.
Figure 9B:
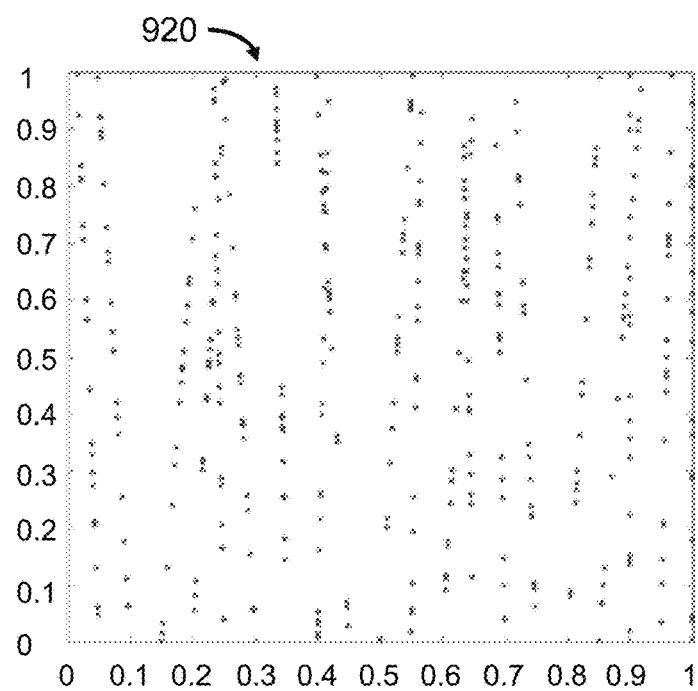
FIG. 9B shows data points sampled by L-method in accordance with an example embodiment.

FIGS. 9A and 9B show graphs 910 and 920 respectively depicting the sampling data points from a set of scattered data using two sampling methods, M-method (M500) and L-method (L400). M-method consists 500 data points, while L-method consists 400 data points and it is sampled from 20 lines.

To demonstrate the accuracy of reconstruction of TB model maps using the hierarchical MK splines approximation, the mean absolute error (MAE) and the root mean square error (RMSE) are used to measure the difference between the original TB maps and the reconstructed TB model maps. In an example embodiment, the TB data are sampled for daytime TB maps and nighttime TB maps from CE-1 lunar probe working at frequencies selected from a group consisting of 3.0 GHz, 7.8 GHz, 19.35 GHz and 37 GHz. The original TB maps have resolution 1°×1°. The sampling area is longitude 180° W×131° W and latitude 38° N×30° S. Half of TB data points in this area is sampled by method M-method and another half is sampled by L-method, respectively. By setting $m_0 = n_0 = 83$, the TB model maps are constructed by the hierarchical MK splines approximation. The RMSE and the MAE are used to evaluate modeling by summarizing the differences between the observed and predicted values. The MAE gives equal weight to all errors, while the RMSE gives extra weight to large errors. The smaller error, the better is the accuracy of the modeling.

$$MAE = \frac{\sum_{i=1}^{M} \sum_{j=1}^{N} (z'(x_i, y_i) - z(x_i, y_i))}{(M+1)(N+1)}$$

$$RMSE = \sqrt{\frac{\sum_{i=1}^{M} \sum_{j=1}^{N} (z'(x_i, y_i) - z(x_i, y_i))^2}{(M+1)(N+1)}}$$

where z' represents the reconstruction TB modeling, z represents the original TB modeling, $x_i = i/M$, $y_i = j/N$ and M represents longitude range of the area, N represents latitude range of the area.

B-spline function method is widely used in geometric modeling. FIGS. 10A and 10B show Tables 1010 and 1020 respectively depicting the result of modeling of nighttime maps and daytime maps by the hierarchical MK splines approximation and multilevel B-splines function method. Under the same sampling conditions, MAE and RMSE of the hierarchical MK splines approximation are much better than that of the multilevel B-splines function method.

Figure 11A:
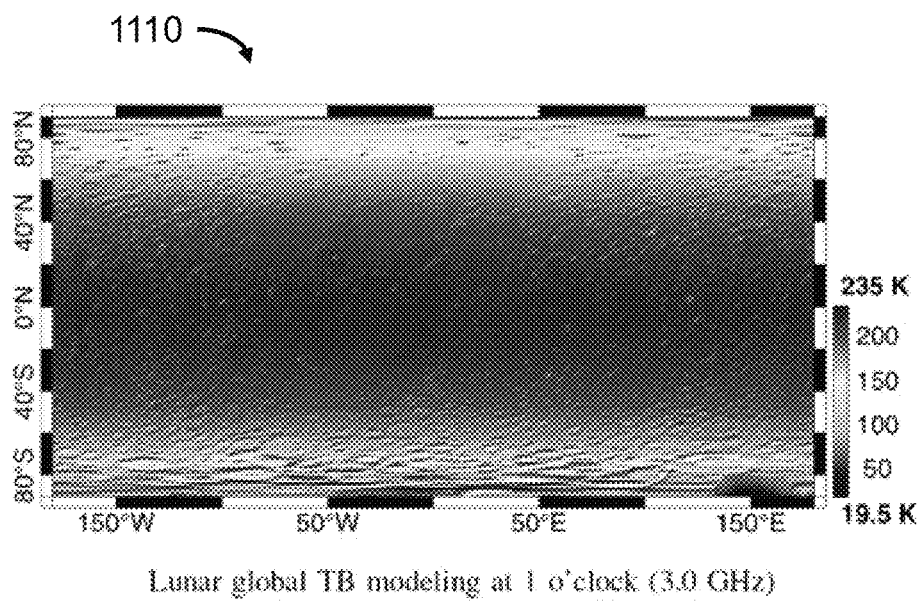
FIG. 11A-11C show TB model maps generated from lunar global TB modeling, lunar North Pole TB modeling and lunar South Pole TB modeling respectively for TB data obtained at 1 o'clock by lunar probe with working frequency 3.0 GHz in accordance with an example embodiment.
Figures 11B, 11C:
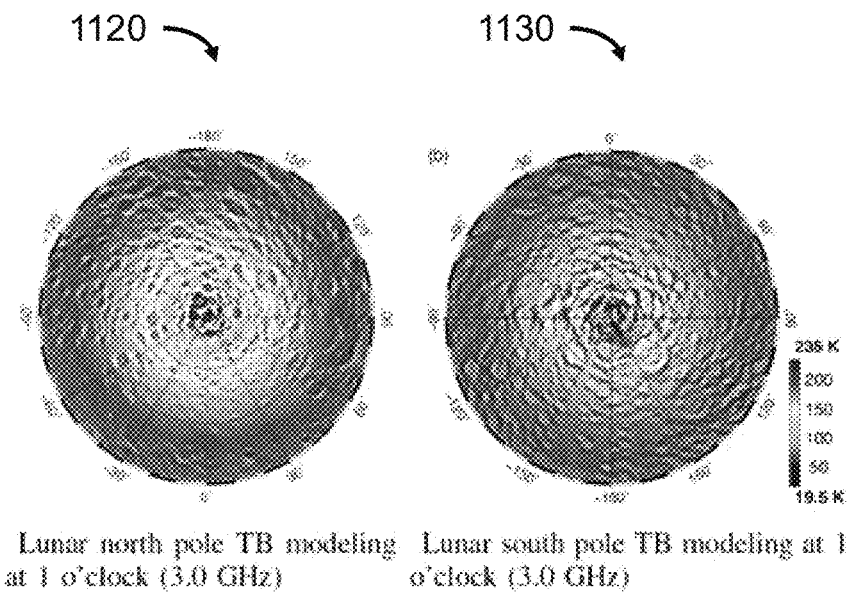

The TB data by CE-2 MRM provides the complete global coverage of the lunar surface, but the TB data of the entire lunar surface cannot be obtained by MRM at the same local time. In order to construct the TB model map of the entire lunar surface, furthermore, to reveal the topographic information and other geological features hidden in the TB data, TB model map of the entire lunar surface is constructed by using two adjacent time of the TB data and the hierarchical MK splines approximation in accordance with an example embodiment. From the MRM of lunar probe CE-2, the TB data of the lunar surface is measured at different lunar times, but each local spot on the lunar surface at different local times is covered by the TB data, sometimes more frequently while other times less so. For any spots on lunar surface, it may be unable to find TB data that corresponds to its values measured exactly. In one example embodiment, two adjacent time are considered because CE-2 spent about 118 minutes that it orbits a round around the Moon. After, most of the lunar surface has the TB data. The hierarchical MK splines approximation is applied to quantize the TB data and obtain the TB model map of the entire lunar surface. FIG. 11A shows TB model map 1110 generated from lunar global TB modeling. FIG. 11B shows TB model map 1120 generated from lunar North Pole TB modeling while FIG. 11C shows TB model map 1130 generated from lunar South Pole TB modeling. The TB model maps in FIGS. 11A, 11B and 11C have resolution 0.5°×0.5° and are constructed from TB data of TB map obtained by lunar probe at 1 o'clock and 3.0 GHz working frequency.

Figure 12A:
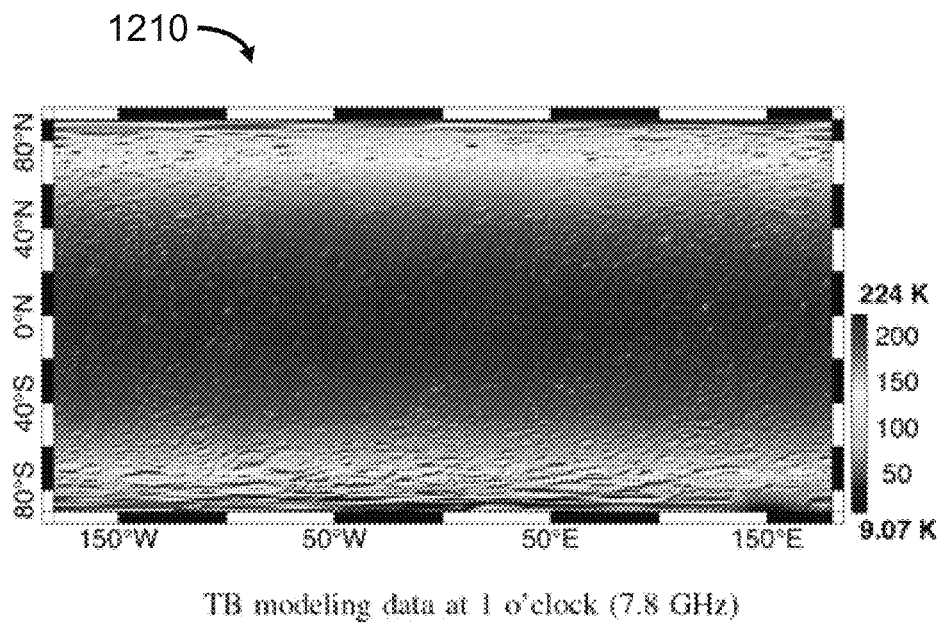
FIG. 12A-12C show TB model maps generated from lunar global TB modeling, lunar North Pole TB modeling and lunar South Pole TB modeling respectively for TB data obtained at 1 o'clock by lunar probe with working frequency 7.8 GHz in accordance with an example embodiment.
Figures 12B, 12C:
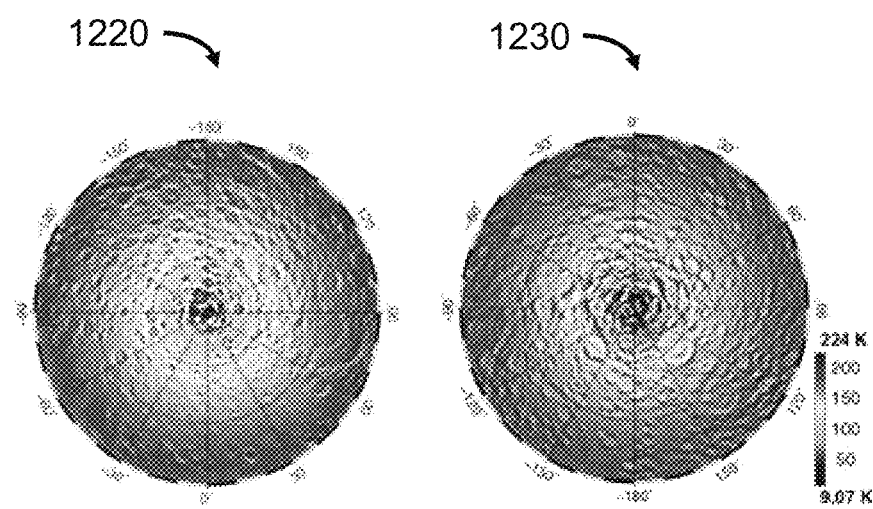

In another embodiment, the TB model maps are constructed from TB data of TB map obtained by lunar probe at 1 o'clock and 7.8 GHz working frequency using the hierarchical MK splines approximation and have resolution 0.5°×0.5° as shown in FIGS. 12A, 12B and 12C. FIG. 12A shows TB model map 1210 generated from lunar global TB modeling. FIG. 12B shows TB model map 1220 generated from lunar North Pole TB modeling while FIG. 12C shows TB model map 1230 generated from lunar South Pole TB modeling.

Figure 13A:
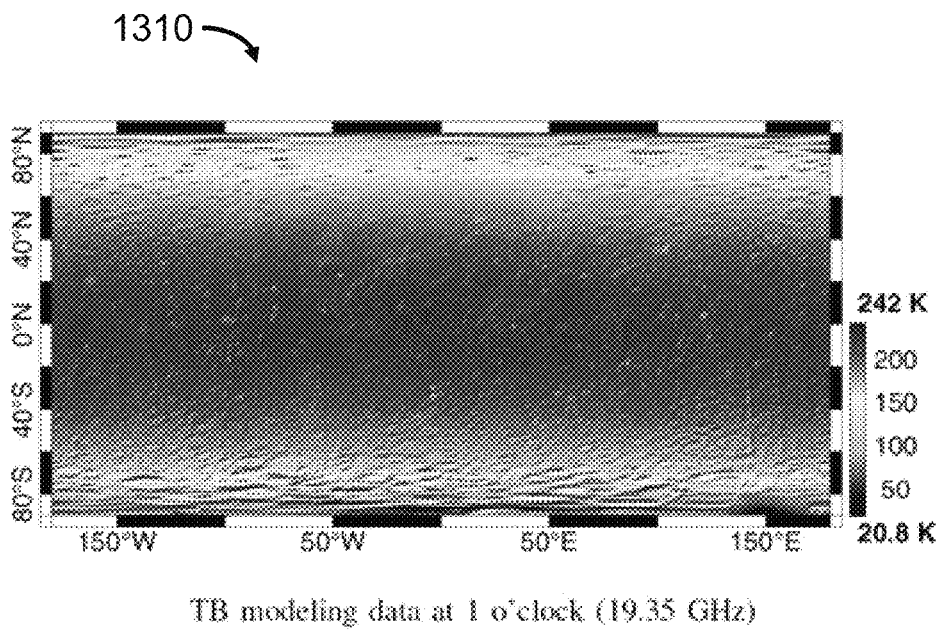
FIG. 13A-13C show TB model maps generated from lunar global TB modeling, lunar North Pole TB modeling and lunar South Pole TB modeling respectively for TB data obtained at 1 o'clock by lunar probe with working frequency 19.35 GHz in accordance with an example embodiment.
Figures 13B, 13C:
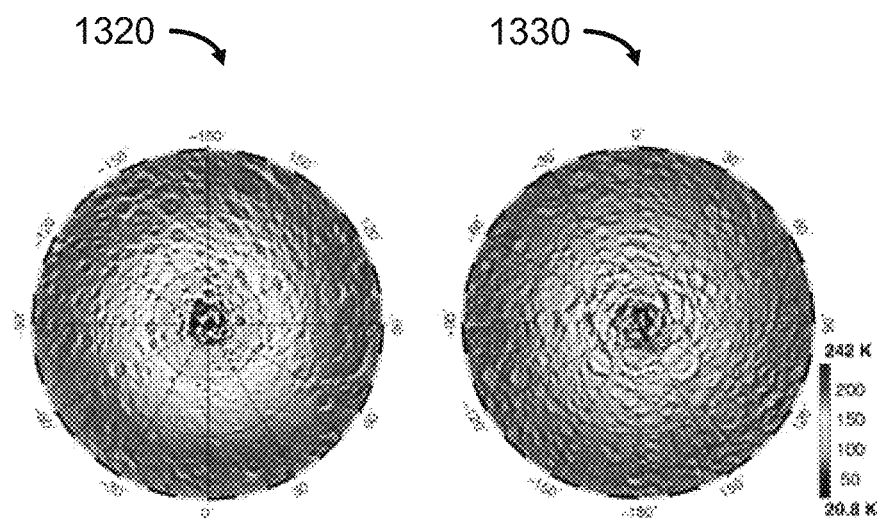

In yet another embodiment, the TB model maps are constructed from TB data of TB map obtained by lunar probe at 1 o'clock and 19.35 GHz working frequency using the hierarchical MK splines approximation and have resolution 0.5°×0.5° as shown in FIGS. 13A, 13B and 13C. FIG. 13A shows TB model map 1310 generated from lunar global TB modeling. FIG. 13B shows TB model map 1320 generated from lunar North Pole TB modeling while FIG. 13C shows TB model map 1330 generated from lunar South Pole TB modeling.

Figure 14A:
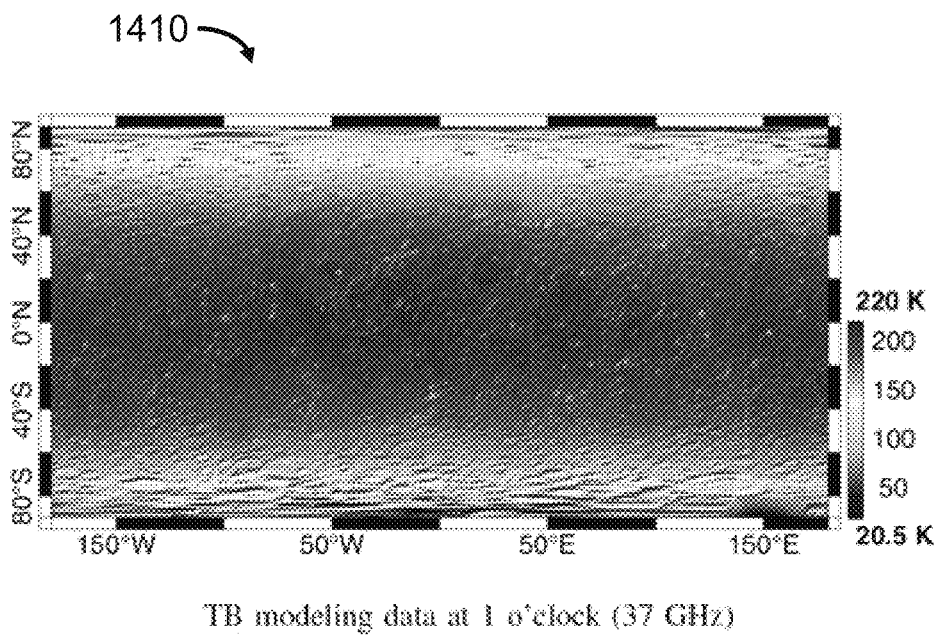
FIG. 14A-14C show TB model maps generated from lunar global TB modeling, lunar North Pole TB modeling and lunar South Pole TB modeling respectively for TB data obtained at 1 o'clock by lunar probe with working frequency 37 GHz in accordance with an example embodiment.
Figures 14B, 14C:
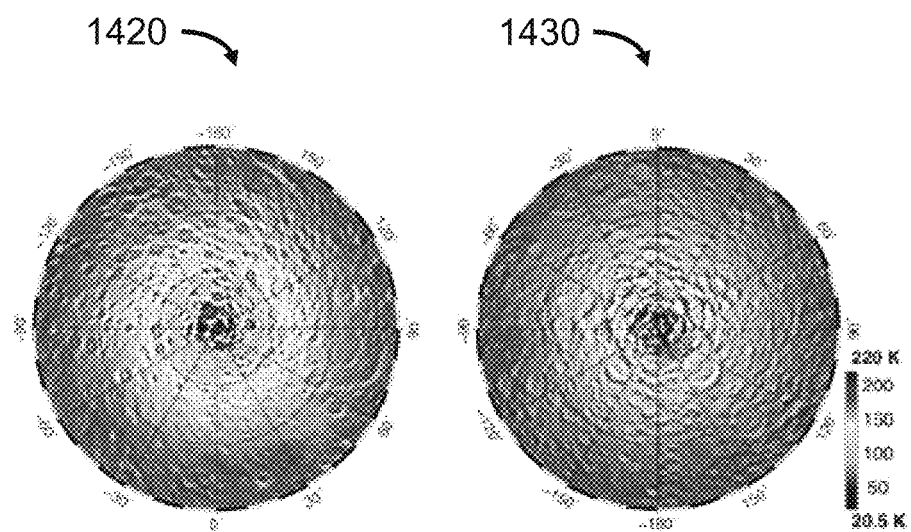

In a further example embodiment, the TB model maps are constructed from TB data of TB map obtained by lunar probe at 1 o'clock and 37 GHz working frequency using the hierarchical MK splines approximation and have resolution 0.5°×0.5° as shown in FIGS. 14A, 14B and 14C. FIG. 14A shows TB model map 1410 generated from lunar global TB modeling. FIG. 14B shows TB model map 1420 generated from lunar North Pole TB modeling while FIG. 14C shows TB model map 1430 generated from lunar South Pole TB modeling.

Figure 15A:
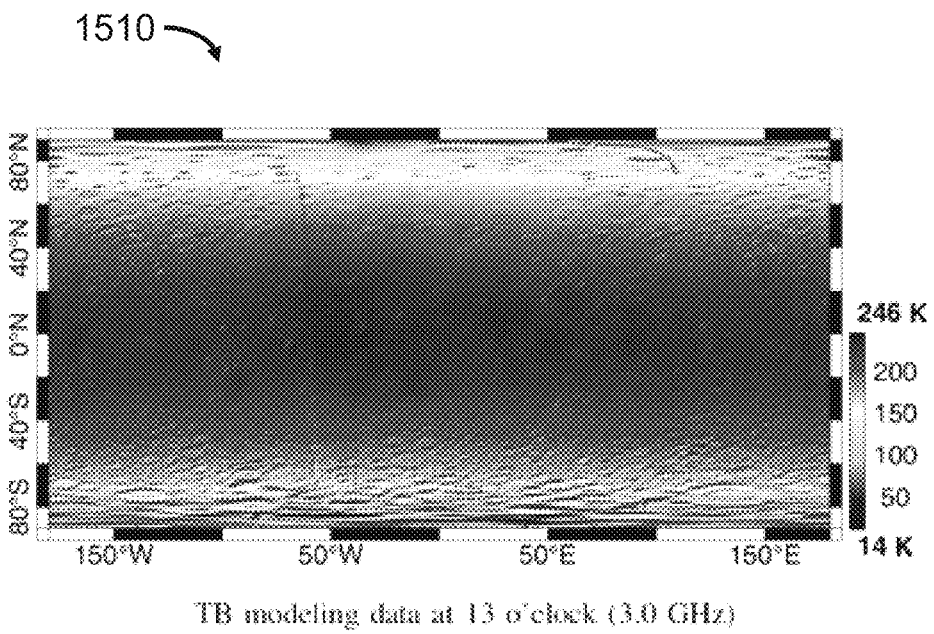
FIG. 15A-15C show TB model maps generated from lunar global TB modeling, lunar North Pole TB modeling and lunar South Pole TB modeling respectively for TB data obtained at 13 o'clock by lunar probe with working frequency 3.0 GHz in accordance with an example embodiment.
Figures 15B, 15C:
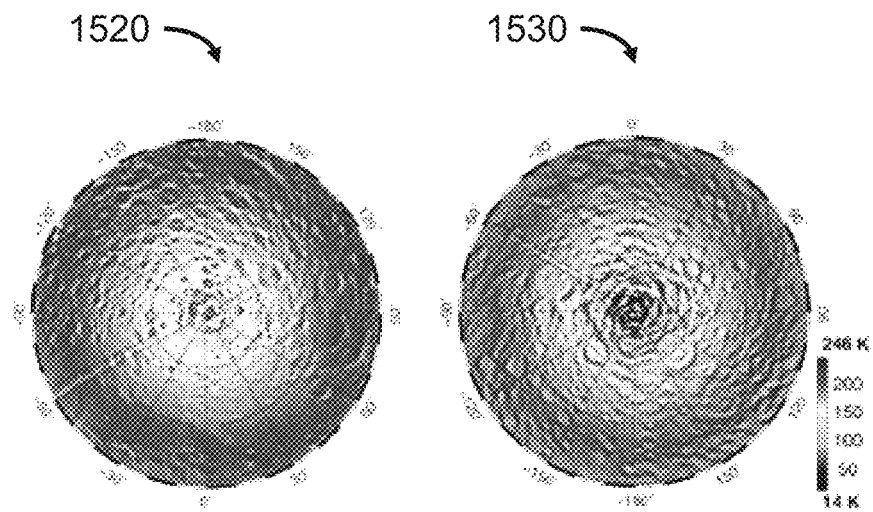

In one embodiment, the TB model maps are constructed from TB data of TB map obtained by lunar probe at 13 o'clock and 3 GHz working frequency using the hierarchical MK splines approximation and have resolution 0.5°×0.5° as shown in FIGS. 15A, 15B and 15C. FIG. 15A shows TB model map 1510 generated from lunar global TB modeling. FIG. 15B shows TB model map 1520 generated from lunar North Pole TB modeling while FIG. 15C shows TB model map 1530 generated from lunar South Pole TB modeling.

Figure 16A:
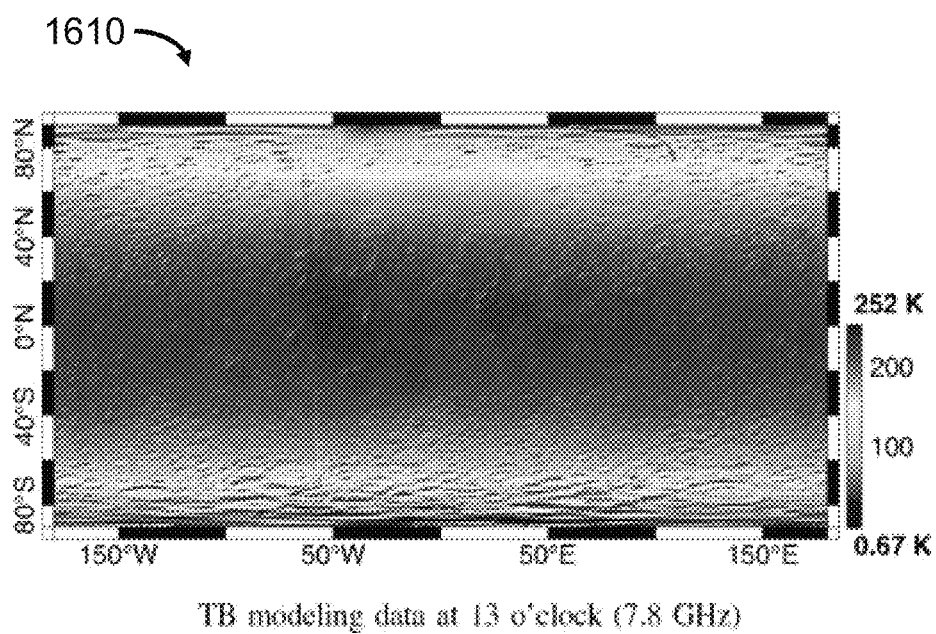
FIG. 16A-16C show TB model maps generated from lunar global TB modeling, lunar North Pole TB modeling and lunar South Pole TB modeling respectively for TB data obtained at 13 o'clock by lunar probe with working frequency 7.8 GHz in accordance with an example embodiment.
Figures 16B, 16C:
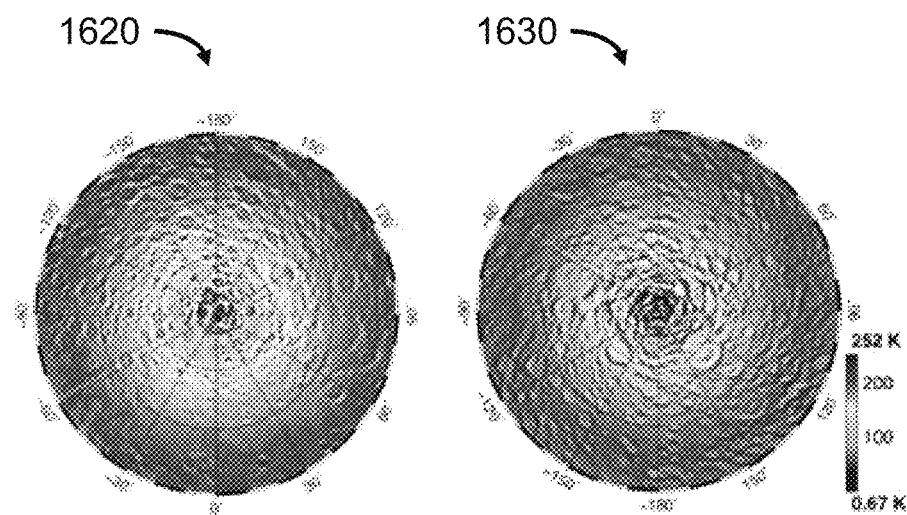

In another embodiment, the TB model maps are constructed from TB data of TB map obtained by lunar probe at 13 o'clock and 7.8 GHz working frequency using the hierarchical MK splines approximation and have resolution 0.5°×0.5° as shown in FIGS. 16A, 16B and 16C. FIG. 16A shows TB model map 1610 generated from lunar global TB modeling. FIG. 16B shows TB model map 1620 generated from lunar North Pole TB modeling while FIG. 16C shows TB model map 1630 generated from lunar South Pole TB modeling.

Figure 17A:
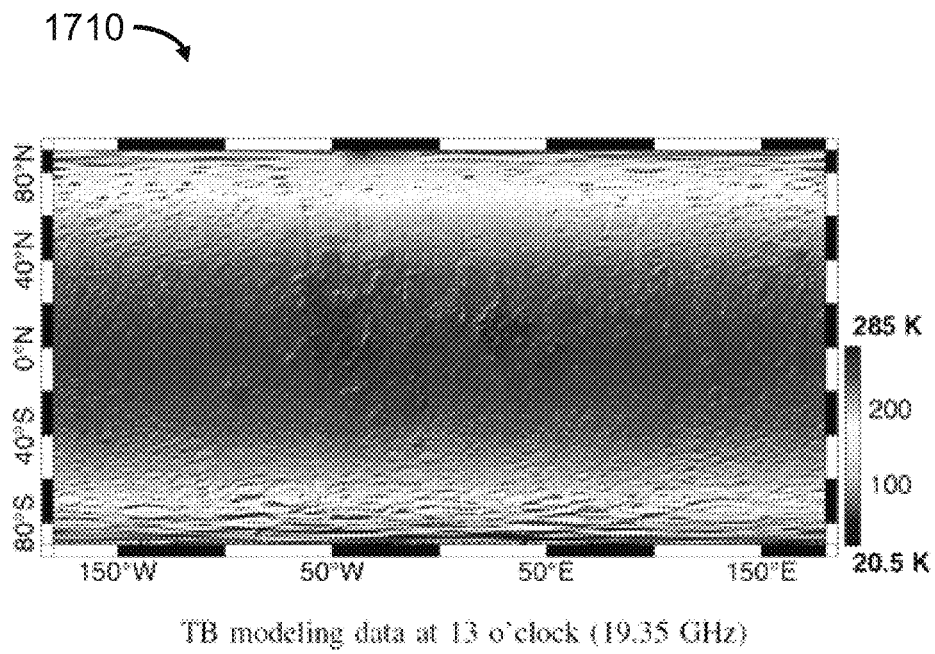
FIG. 17A-17C show TB model maps generated from lunar global TB modeling, lunar North Pole TB modeling and lunar South Pole TB modeling respectively for TB data obtained at 13 o'clock by lunar probe with working frequency 19.35 GHz in accordance with an example embodiment.
Figures 17B, 17C:
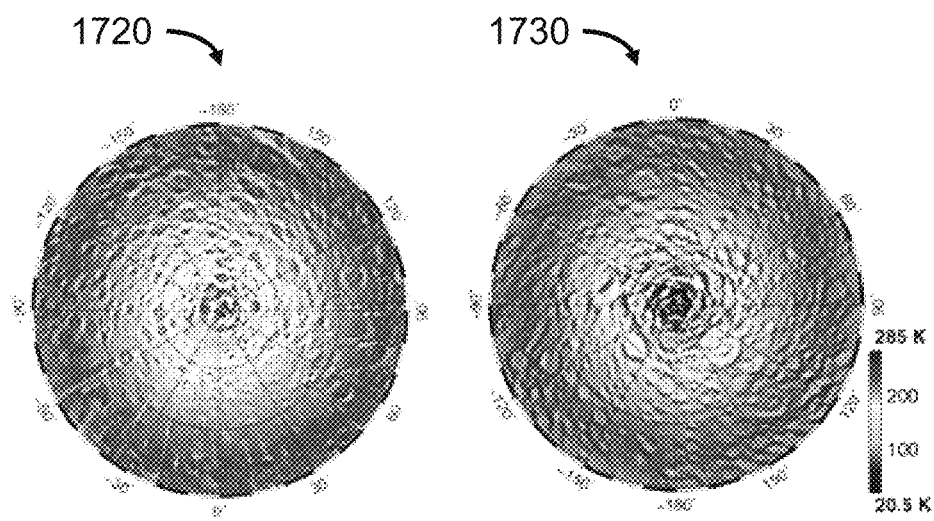

In yet another embodiment, the TB model maps are constructed from TB data of TB map obtained by lunar probe at 13 o'clock and 19.35 GHz working frequency using the hierarchical MK splines approximation and have resolution 0.5°×0.5° as shown in FIGS. 17A, 17B and 17C. FIG. 17A shows TB model map 1710 generated from lunar global TB modeling. FIG. 17B shows TB model map 1720 generated from lunar North Pole TB modeling while FIG. 17C shows TB model map 1730 generated from lunar South Pole TB modeling.

Figure 18A:
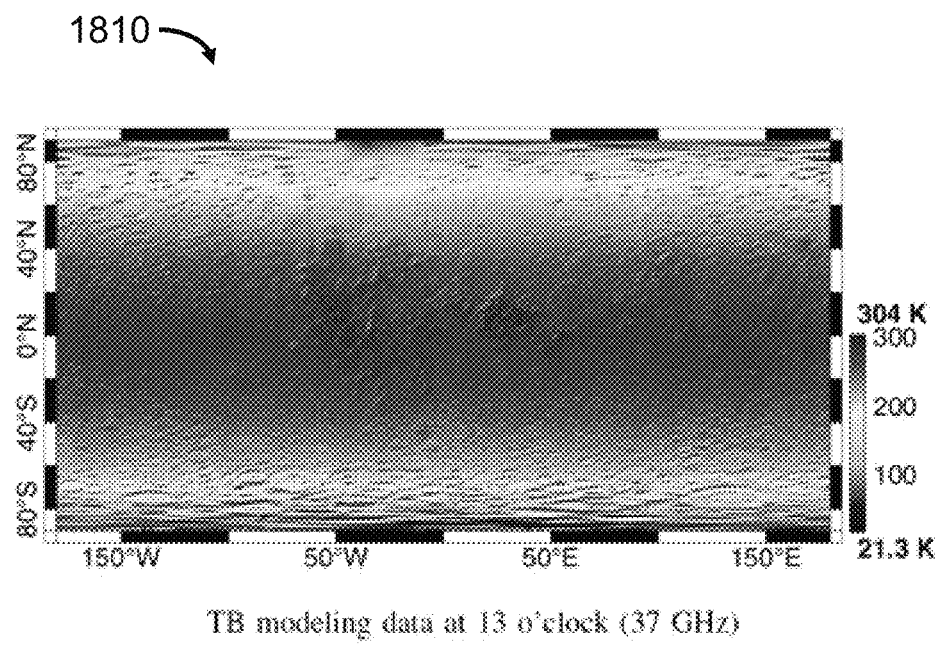
FIG. 18A-18C show TB model maps generated from lunar global TB modeling, lunar North Pole TB modeling and lunar South Pole TB modeling respectively for TB data obtained at 13 o'clock by lunar probe with working frequency 37 GHz in accordance with an example embodiment.
Figures 18B, 18C:
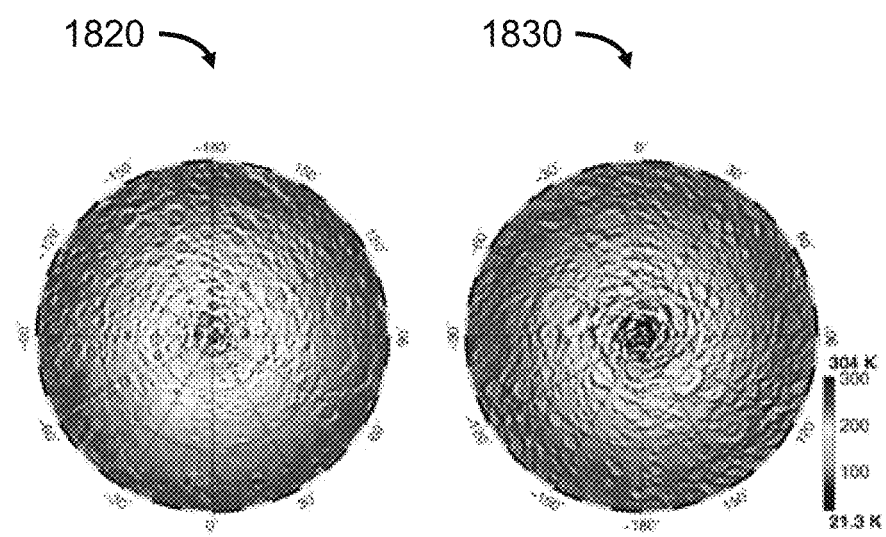

In a further example embodiment, the TB model maps are constructed from TB data of TB map obtained by lunar probe at 13 o'clock and 37 GHz working frequency using the hierarchical MK splines approximation and have resolution 0.5°×0.5° as shown in FIGS. 18A, 18B and 18C. FIG. 18A shows TB model map 1810 generated from lunar global TB modeling. FIG. 18B shows TB model map 1820 generated from lunar North Pole TB modeling while FIG. 18C shows TB model map 1830 generated from lunar South Pole TB modeling.

From the results as shown in FIG. 11 to FIG. 18, it can be found that when the lunar probe frequency increases, the lunar surface topography affects the TB value more and the lunar surface topography is more obviously revealed. The higher frequency of the lunar probe for obtaining TB data, the more lunar surface details are reflected. The TB data obtained by lunar probe with 3.0 GHz channel mainly just shows that the TB value varies with longitude variation because the penetration depth of emitting electromagnetic radiation by 3.0 GHz channel is greater than the other three frequencies, so the influence of the lunar surface topography on the TB is comparably not obvious.

Figure 19A:
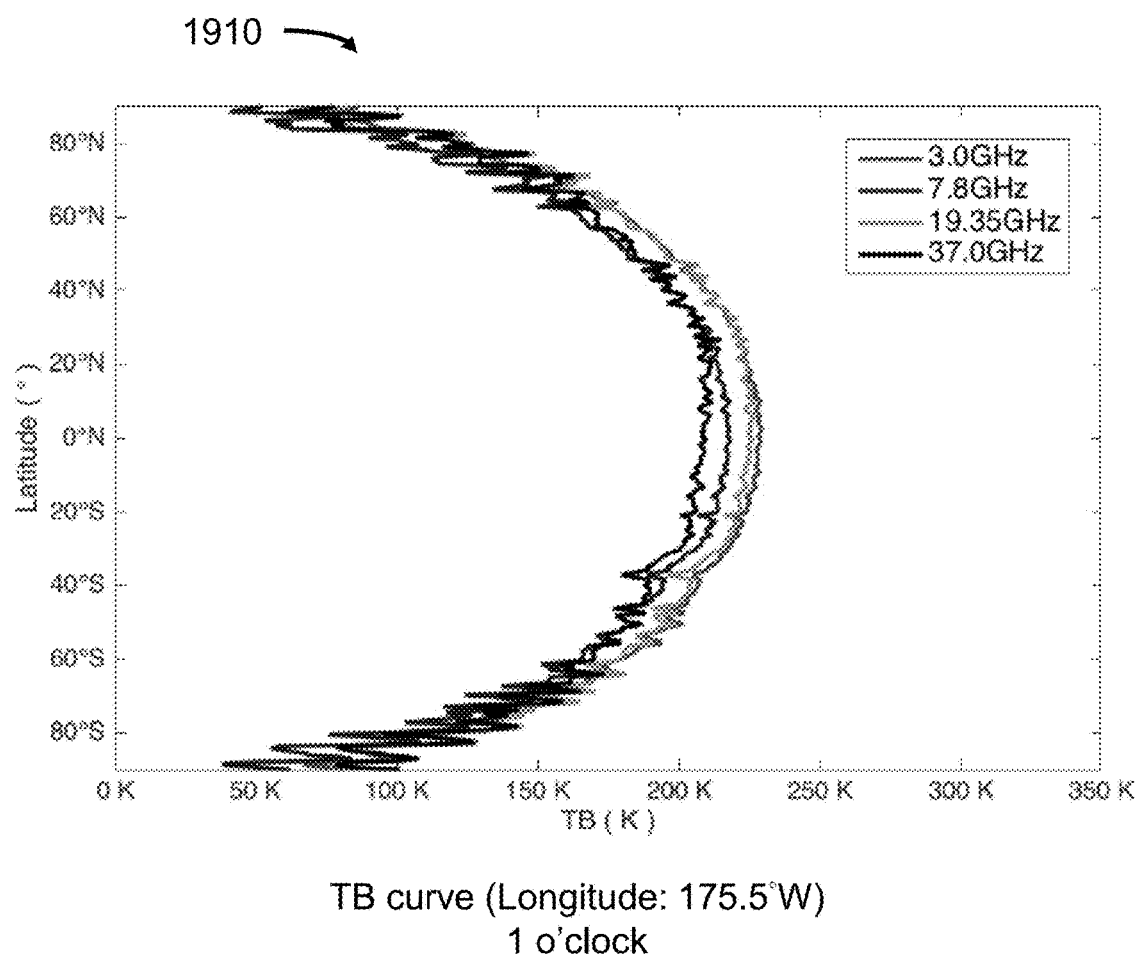
FIGS. 19A and 19B show TB curves which vary with latitude at longitude: 175.5° W obtained by lunar probe at 1 o'clock and 13 o'clock respectively in accordance with an example embodiment. The lunar probe operated at frequency channels 3.0 GHz, 7.8 GHz, 19.35 GHz and 37.0 GHz
Figure 19B:
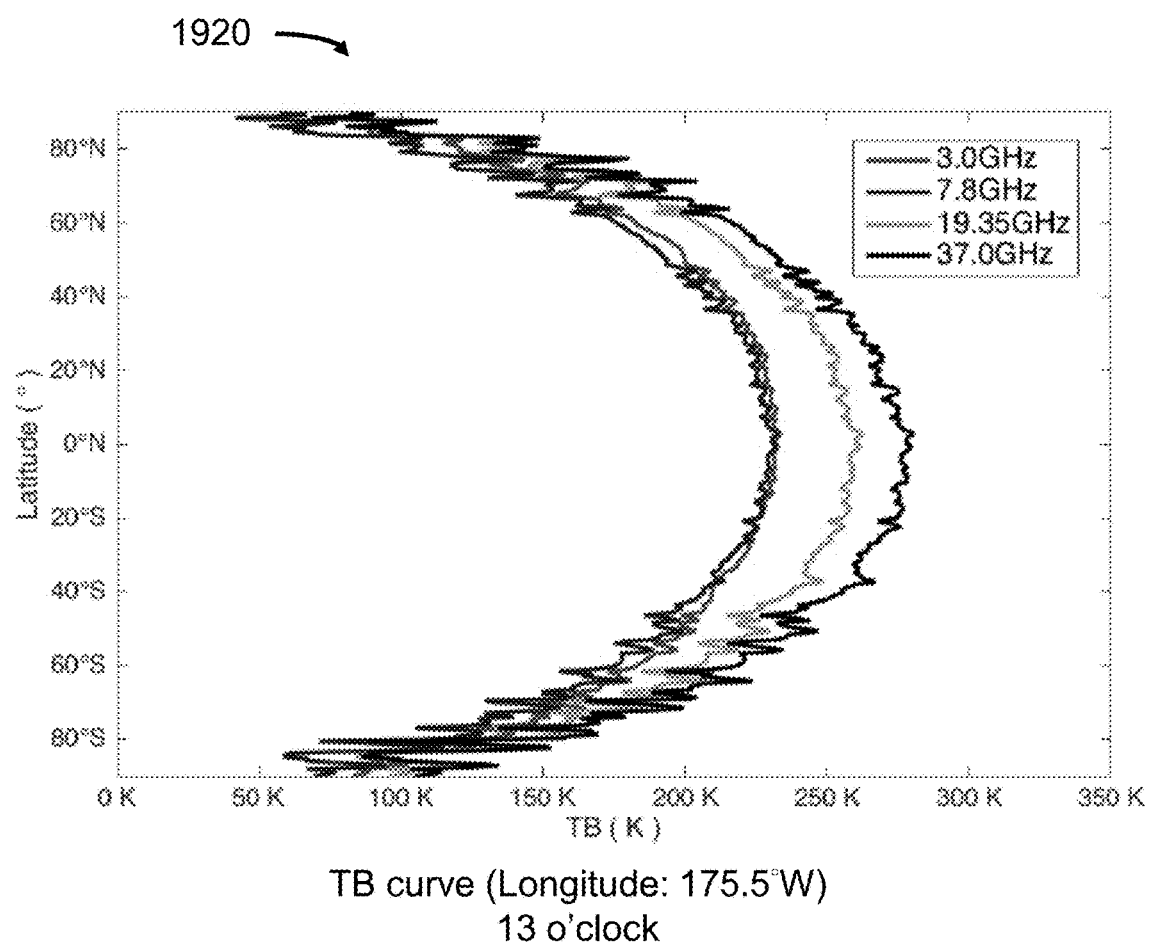
Figure 19C:
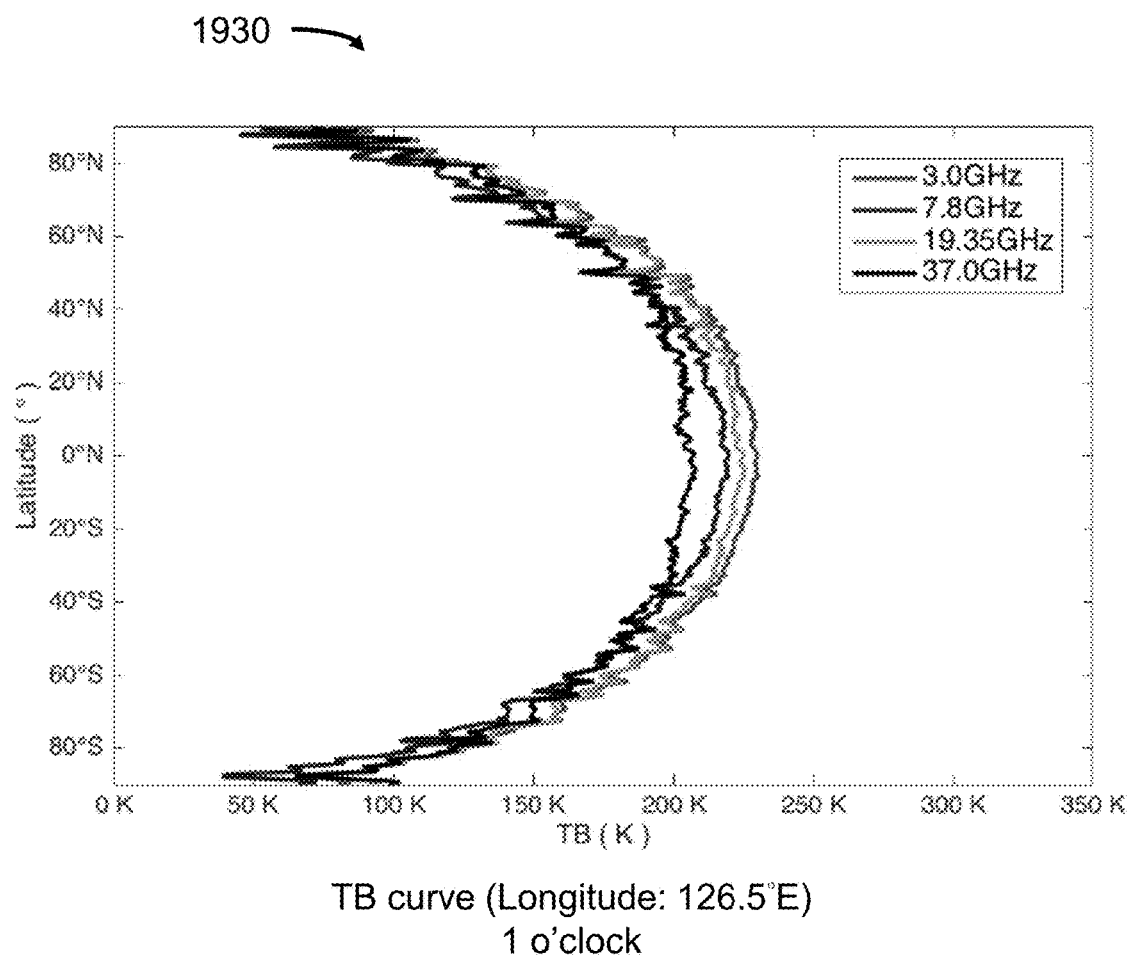
FIGS. 19C and 19D show TB curves which vary with latitude at longitude: 126.5° E obtained by lunar probe at 1 o'clock and 13 o'clock respectively in accordance with an example embodiment. The lunar probe operated at frequency channels 3.0 GHz, 7.8 GHz, 19.35 GHz and 37.0 GHz
Figure 19D:
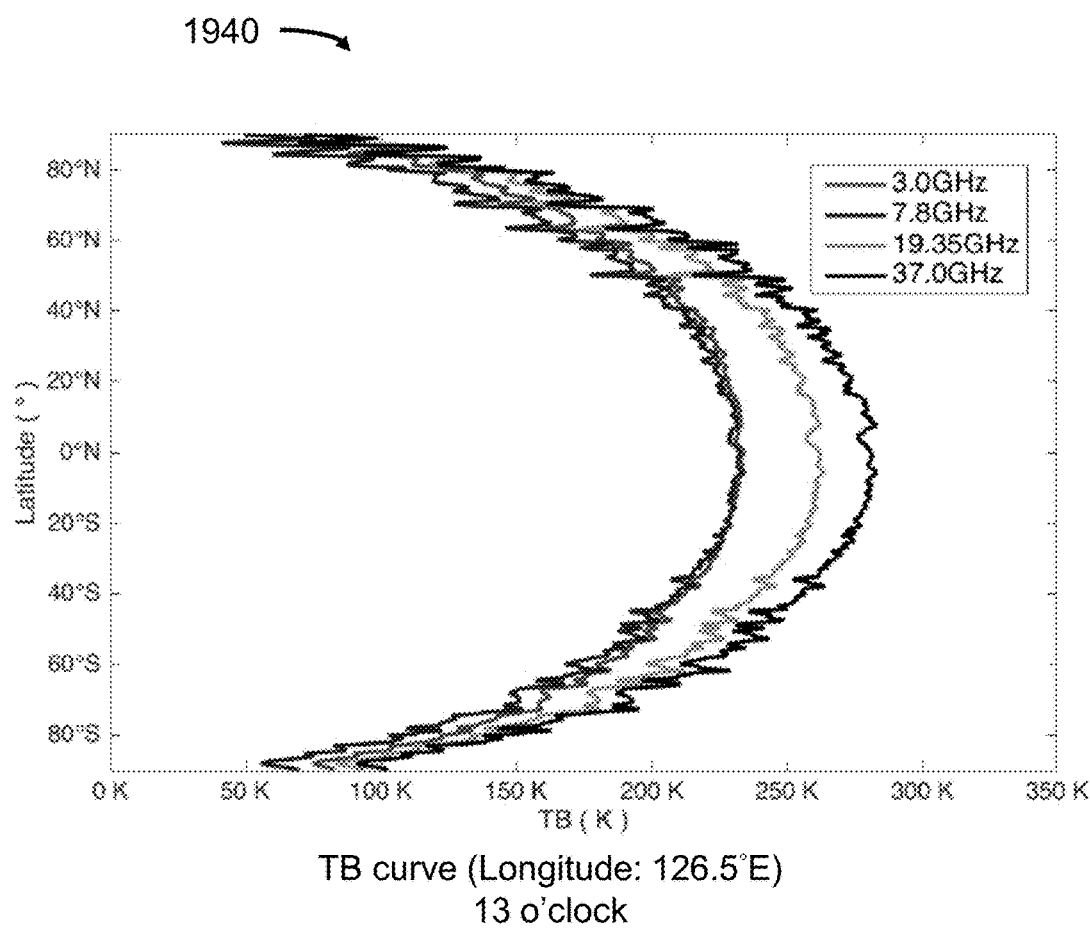
Figure 20A:
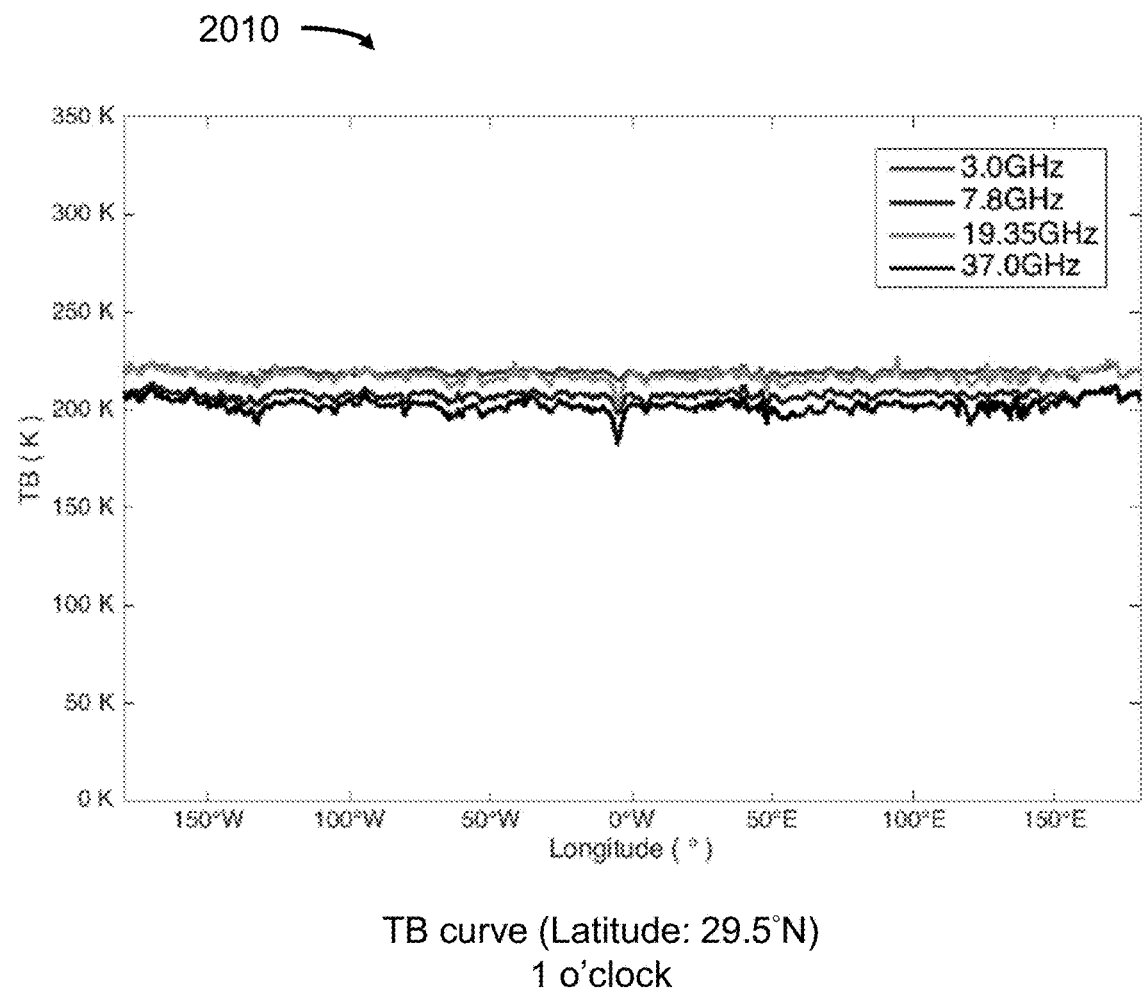
FIGS. 20A and 20B show TB curves 2010 and 2020 which vary with longitude at latitude: 29.5° N obtained by lunar probe at 1 o'clock and 13 o'clock respectively in accordance with an example embodiment. The lunar probe operated at frequency channels 3.0 GHz, 7.8 GHz, 19.35 GHz and 37.0 GHz
Figure 20B:
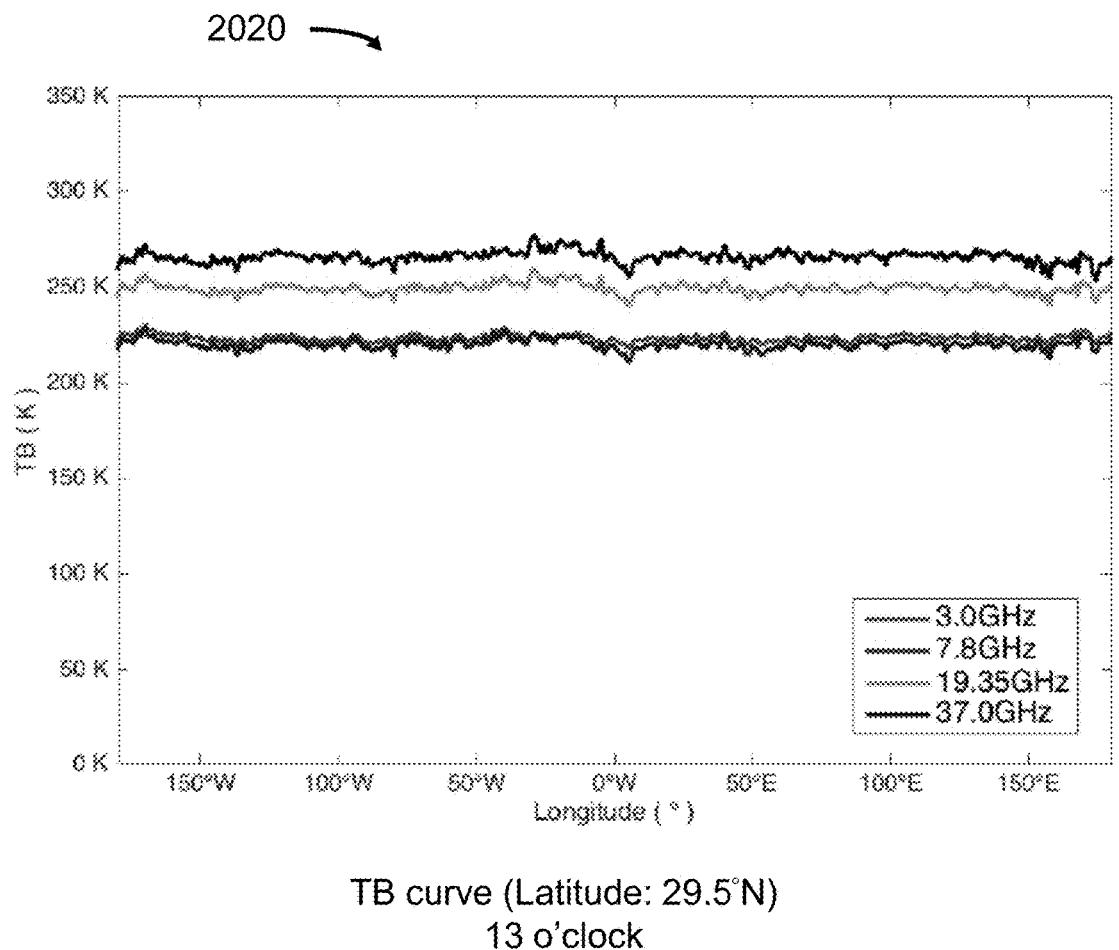
Figure 20C:
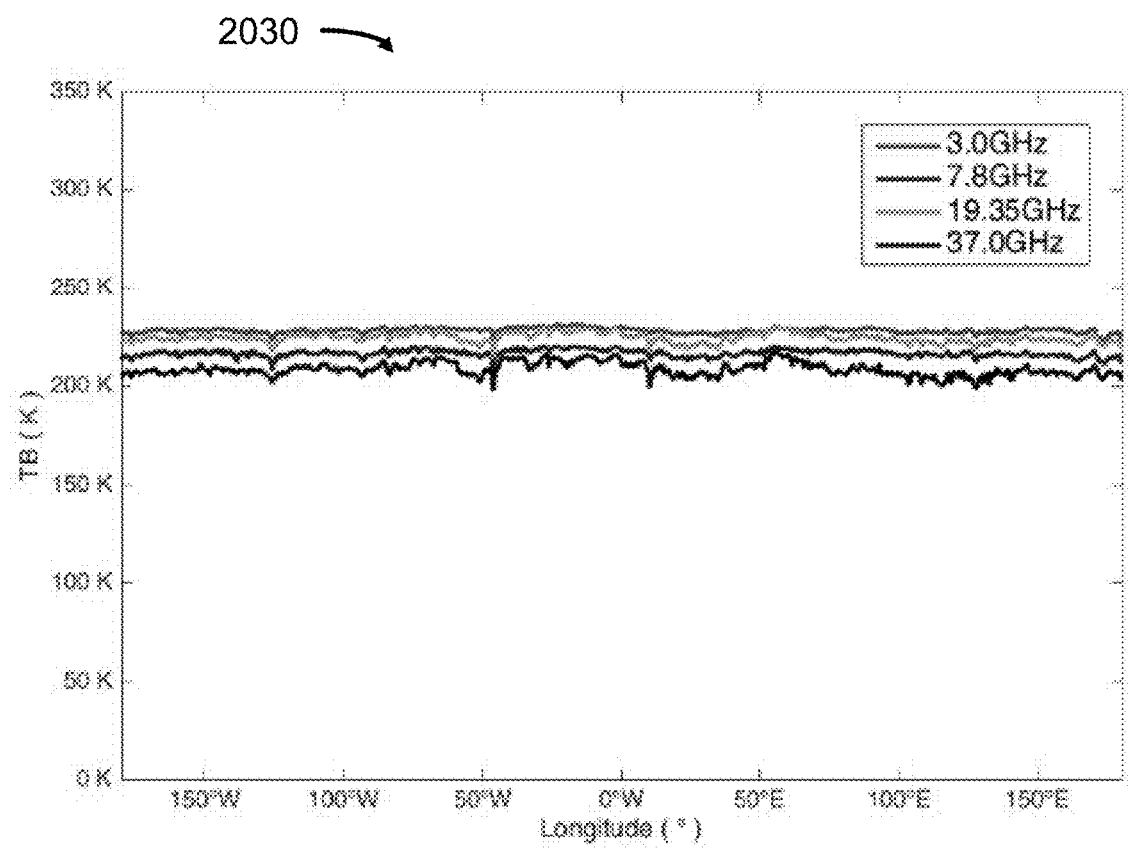
FIGS. 20C and 20D show TB curves 2030 and 2040 which vary with longitude at latitude: 12.5° S obtained by lunar probe at 1 o'clock and 13 o'clock respectively in accordance with an example embodiment. The lunar probe operated at frequency channels 3.0 GHz, 7.8 GHz, 19.35 GHz and 37.0 GHz
Figure 20D:
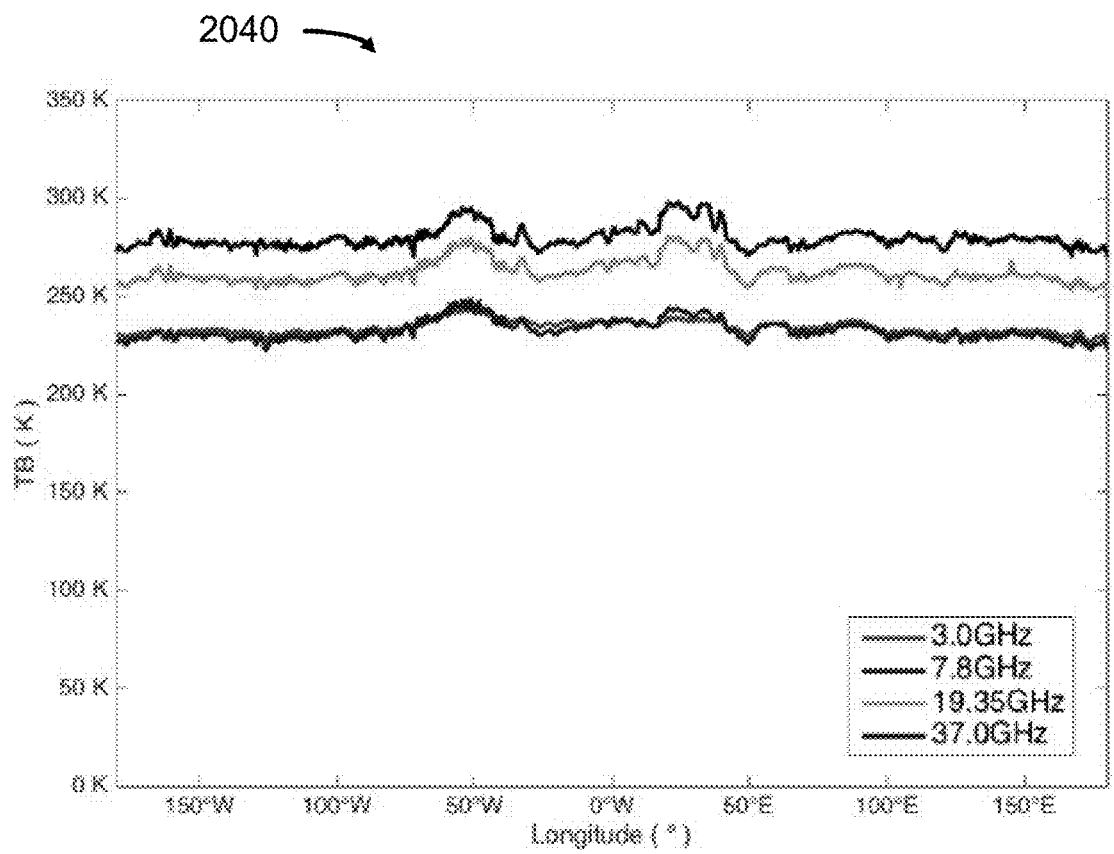

FIGS. 19A and 19B show TB curves 1910 and 1920 which vary with latitude at longitude: 175.5° W obtained by lunar probe at 1 o'clock and 13 o'clock respectively. FIGS. 19C and 19D show TB curves 1930 and 1940 which vary with latitude at longitude: 126.5° E obtained by lunar probe at 1 o'clock and 13 o'clock respectively. FIGS. 20A and 20B show TB curves 2010 and 2020 which vary with longitude at latitude: 29.5° N obtained by lunar probe at 1 o'clock and 13 o'clock respectively. FIGS. 20C and 20D show TB curves 2030 and 2040 which vary with longitude at latitude: 12.5° S obtained by lunar probe at 1 o'clock and 13 o'clock respectively. The lunar probe operated at frequency channels 3.0 GHz, 7.8 GHz, 19.35 GHz and 37.0 GHz and have different penetration of emitting electromagnetic radiation which causes the distributional difference of the TB data. When under the same longitude, the TB data value decreases with increasing latitude, while under the same latitude, variation of longitude has a little effect on the TB data value. It can also be seen that the higher the lunar probe frequency, the higher the TB data value in lunar daytime (13 o'clock), but in lunar nighttime (1 o'clock), the higher the lunar probe frequency, the lower the TB data value. It is well known that high frequency channels have small penetration depth through the loss media, while low frequency channel can penetrate much deeper. The measured TB data at 37.0 GHz is lower than 3.0 GHz at lunar nighttime, it might be caused by the calibration problem, the inhomogeneous temperature of the dielectric properties in the regolith media or some other reasons.

Figure 21:
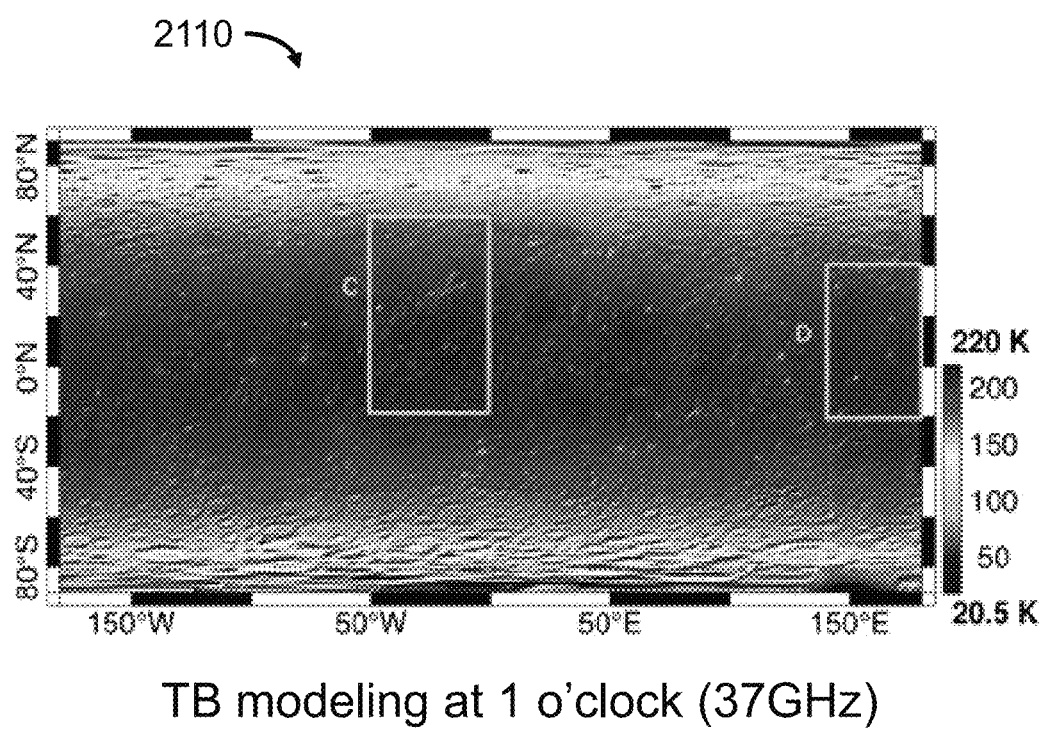
FIG. 21 shows TB model map constructed from TB data obtained by lunar probe operating at frequency channel 37 GHz at 1 o'clock in accordance with an example embodiment.
Figure 22A:
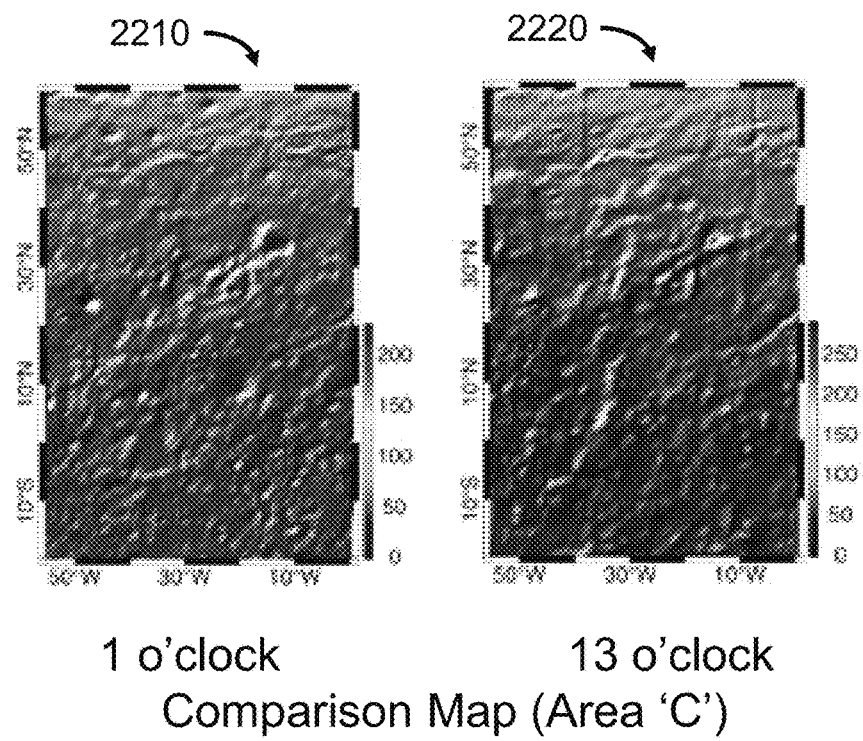
FIG. 22A shows TB model maps which are obtained from area 'C' of the TB model map in FIG. 21 at 1 o'clock and 13 o'clock respectively in accordance with an example embodiment.
Figure 22B:
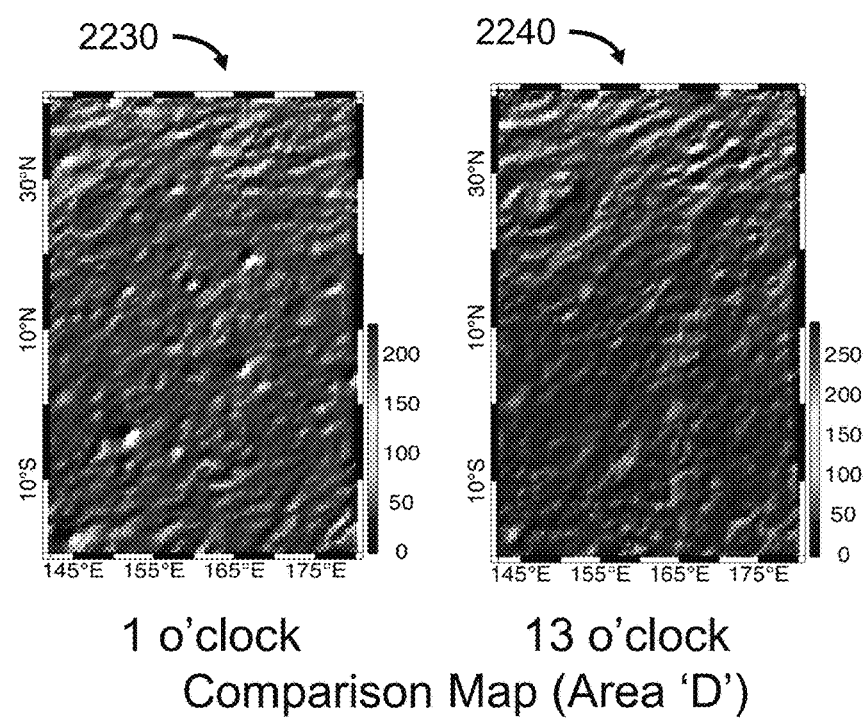
FIG. 22B shows TB model maps which are obtained from area 'D' of the TB model map in FIG. 21 at 1 o'clock and 13 o'clock respectively in accordance with an example embodiment.

FIG. 21 shows TB model map constructed from TB data obtained by lunar probe operating at frequency channel 37 GHz at 1 o'clock. Compared TB model maps of daytime (13 o'clock) with TB model maps of nighttime (1 o'clock), it can be found that TB model maps of nighttime have more detailed features than TB model maps of daytime, as are shown in FIGS. 22A and 22B. FIG. 22A shows TB model maps 2210 and 2220 which are obtained from area 'C' of the TB model map 2110 in FIG. 21 at 1 o'clock and 13 o'clock respectively. FIG. 22B shows TB model maps 2230 and 2240 which are obtained from area 'D' of the TB model map 2110 in FIG. 21 at 1 o'clock and 13 o'clock respectively. TB model maps 2210 and 2230 are the same area with TB model maps 2230 and 2240 respectively. For the other three frequency channels of lunar probe, TB model maps have a similar situation that showing TB model maps of nighttime have more detailed features than TB model maps of daytime. This is because the terrain and shaded area of the lunar surface affect the TB modeling to reflect characteristics of the terrain. Shaded area is the area where the sun does not reach. In addition, the relationship between these characteristics of the terrain and lunar terrain, temperature, thickness of lunar soil can be further studied. Thus, it can be found that lunar TB modeling reflects lunar topographic to a certain extent. Because the penetrative power of microwave emissions, the obtained TB modeling provides a new window to study the lunar surface, such as terrain features, the physical and geological properties of lunar regolith layer.

In one example embodiment, a method executed by a computer system can construct a TB model map of a lunar surface from a TB data set T of a TB map of the lunar surface in a resolution of 1°×1°, 0.5°×0.5°, 0.25°×0.25° or 0.125°× 0.125°. In another example embodiment, the TB model map of the lunar surface has a resolution equal to or higher than a resolution of the TB map of the lunar surface.

Figure 23:
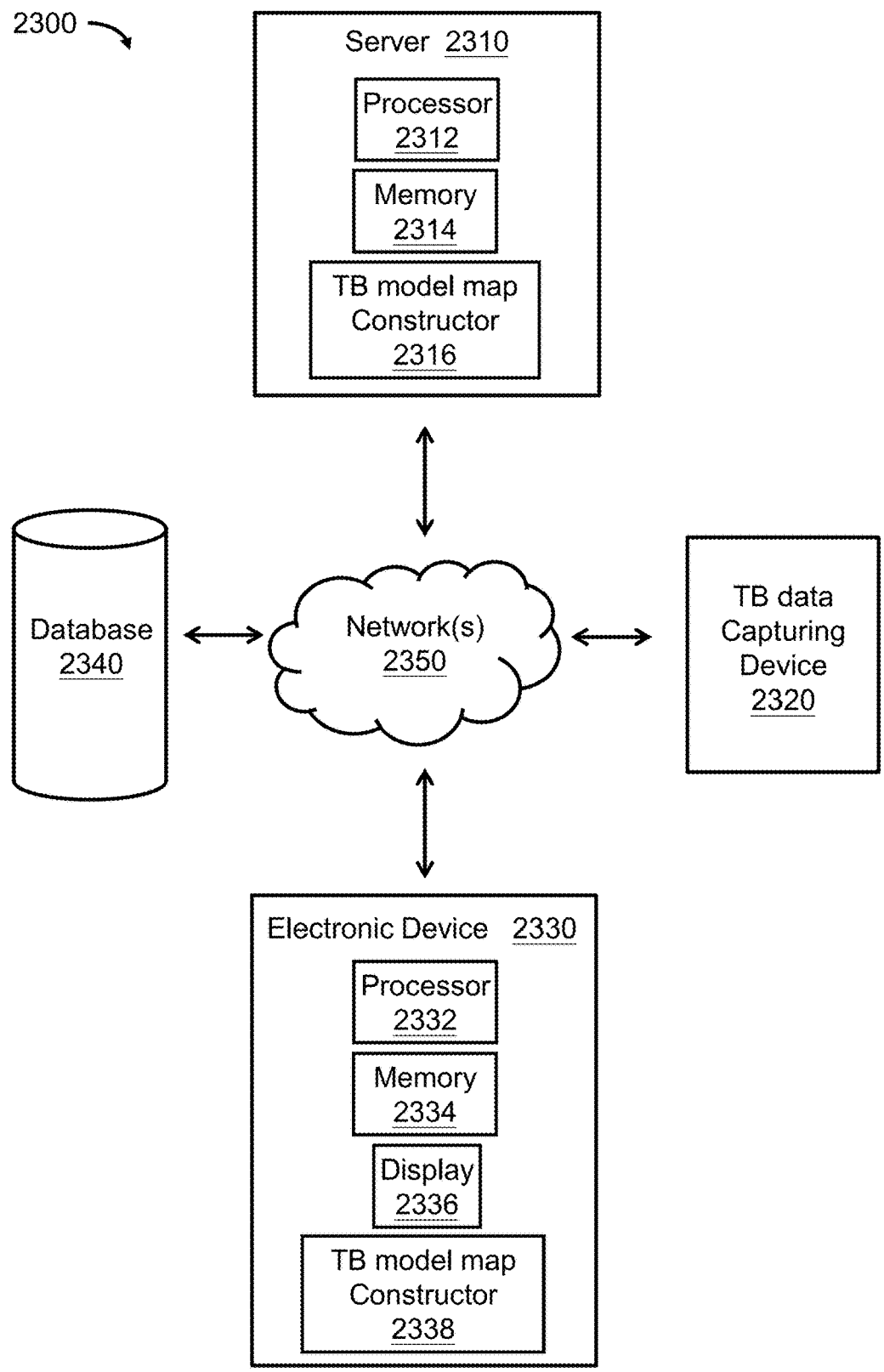
FIG. 23 shows a computer system executes and displays a constructed TB model map generated from a TB data set using the hierarchical MK splines approximation in accordance with an example embodiment.

FIG. 23 shows a computer system 2300 that executes and displays a constructed TB model map generated from a TB data set T using hierarchical MK splines approximation in one example embodiment. The computer system includes one or more of a server 2310, a TB map capturing device 2320, an electronic device 2330, and a database 2340 in communication via one or more networks 2350.

The server 2310 includes a processor or processing unit 2312, a memory 2314, and a TB model map constructor 2316.

The TB data capturing device 2320 includes one or more devices to capture TB data, such as MRM.

The electronic device 2330 includes one or more of a processor or processing unit 2332, memory 2334, display 2336, and TB model map constructor 2338. Examples of an electronic device include, but are not limited to, laptop computers, desktop computers, tablet computers, handheld portable electronic devices (HPEDs), and other portable and non-portable electronic devices.

The database 2340 includes electronic storage or memory and can store TB data or other information to assist in executing example embodiments.

The network(s) 2350 can include one or more of a wired network or wireless network, such as the internet, cellular network, etc.

The processor, memory, and/or TB model map constructor in the server 2310 and/or electronic device 2330 execute methods in accordance with example embodiments. The TB model map constructor can include software and/or specialized hardware to execute example embodiments.

The processor unit includes a processor (such as a central processing unit, CPU, microprocessor, microcontrollers, field programmable gate array (FPGA), application-specific integrated circuit (ASIC), etc.) for controlling the overall operation of memory (such as random access memory (RAM) for temporary data storage, read only memory (ROM) for permanent data storage, and firmware). The processing unit and TB model map constructor communicate with each other and memory and perform operations and tasks that implement one or more blocks of the flow diagrams discussed herein. The memory, for example, stores applications, data, programs, algorithms (including software to implement or assist in implementing example embodiments) and other data.

In some example embodiments, the methods illustrated herein and data and instructions associated therewith are stored in respective storage devices, which are implemented as computer-readable and/or machine-readable storage media, physical or tangible media, and/or non-transitory storage media. These storage media include different forms of memory including semiconductor memory devices such as DRAM, or SRAM, Erasable and Programmable Read-Only Memories (EPROMs), Electrically Erasable and Programmable Read-Only Memories (EEPROMs) and flash memories; magnetic disks such as fixed and removable disks; other magnetic media including tape; optical media such as Compact Disks (CDs) or Digital Versatile Disks (DVDs). Note that the instructions of the software discussed above can be provided on computer-readable or machine-readable storage medium, or alternatively, can be provided on multiple computer-readable or machine-readable storage media distributed in a large system having possibly plural nodes. Such computer-readable or machine-readable medium or media is (are) considered to be part of an article (or article of manufacture). An article or article of manufacture can refer to any manufactured single component or multiple components.

Blocks and/or methods discussed herein can be executed and/or made by a user, a user agent (including machine learning agents and intelligent user agents), a software application, an electronic device, a computer, firmware, hardware, a process, a computer system, and/or an intelligent personal assistant. Furthermore, blocks and/or methods discussed herein can be executed automatically with or without instruction from a user.

The methods in accordance with example embodiments are provided as examples, and examples from one method should not be construed to limit examples from another method. Further, methods discussed within different figures can be added to or exchanged with methods in other figures. Further yet, specific numerical data values (such as specific quantities, numbers, categories, etc.) or other specific information should be interpreted as illustrative for discussing example embodiments. Such specific information is not provided to limit example embodiments.

Example embodiments can be used to other areas of computer graphics, such as image warping, data compression, object reconstruction.

As used herein, "at 1 o'clock" and "at 13 o'clock" refers to being within a narrow time frame. Under certain conditions, the smaller time frame, the better distribution of the lunar surface TB variations with longitude/latitude and better effect of lunar surface topography for TB. On the other hand, lunar surface's temperature affects the original TB data, but lunar surface's temperature not only varies with longitude/latitude, but also varies with time for a certain area. If the time frame is too small, many areas of lunar surface will have no microwave TB value. When using TB data within a large time frame to obtain a TB model map, the effect of lunar surface topography, regolith characteristic and the distribution of the TB will greatly decrease. Besides, in a narrow time frame, the temperature of lunar surface changes small, TB variations with longitude/latitude is considered to be very small and the TB doesn't vary with time. Then, the distribution of the lunar surface TB variations with longitude/latitude performs more obvious, the effect of other factors for lunar surface TB also can be better expressed.

As used herein, "two adjacent time" refers to two time frames separated at time intervals of one hour. Only considering the TB data between the adjacent time as the current of the TB data still has limitations, because the CE-2's MRM failed samples the TB data of some areas in the adjacent time, the constructed TB model map contains some abnormal TB areas, such as the area in longitude: 130° E to 170° E and latitude: 80° S to 90° S in FIGS. 11 to 14, the area in longitude: 50° W to 10° W and latitude: 80° N to 90° N in FIGS. 15 to 18. For these abnormal TB areas, the TB data of the same area in another time is considered and is combined with other ways (such as generative model) to obtained the current of the TB data.

What is claimed is:

1. A method of processing an improved image of an entire lunar surface at a current time, the method comprising:
   setting, on a passive microwave radiometer of a lunar probe, a time frame sufficient for acquiring brightness temperature (TB) data of the lunar surface;
   sampling, by the passive microwave radiometer of the lunar probe, the TB data of the lunar surface within the time frame at a specific frequency at the current time to form a first data set;
   filling a region having no sampled TB data of the lunar surface at the current time with TB data from two adjacent times to form a second data set;
   generating a complete TB data set (T) for the entire lunar surface by combining the first data set and the second data set;
   producing, by a computer system, the improved image of the entire lunar surface using the complete data set (T) by:
      setting, by the computer system, a hierarchy of control lattice $C_0, C_1, \ldots, C_h$, wherein $C_0$ is a coarsest control lattice and $C_h$ is a densest control lattice, $C_k$ is the control lattice at a level k of the hierarchy of control lattice, and a spacing between control points in the control lattice is smaller from one lattice to a next lattice;
      executing, by the computer system, many-knot (MK) splines approximation to T with the coarsest control lattice $C_0$ to obtain an approximation function $f_0$ that is a smoothest approximation function of T;
      calculating, by the computer system, a first deviation $\Delta^1 z_{TB}$ of $f_0$ for each data in T to generate a deviation data set $T_1$;
      performing, by the computer system, iteration steps for the control lattices from $C_1$ to $C_h$ to generate a sequence of approximation function from $f_1$ to $f_h$, the iteration steps comprising:
         for the level k of the hierarchy of control lattice, summing, by the computer system, functions from $f_0$ to $f_{k-1}$ to yield a smaller deviation $\Delta^k z_{TB}$ for each data in T to generate a deviation data set $T_k$; and
         executing, by the computer system, the MK splines approximation with the control lattice $C_k$ to the deviation data set $T_k$ to obtain an approximation function $f_k$; and
      generating, by the computer system, a final approximation function f by summing $f_0$ to $f_h$ to construct an interpolated surface;
   constructing, by the computer system, the improved image from the interpolated surface; and
   displaying, by the computer system, the improved image to show the brightness temperature of the lunar surface, wherein a resolution of the improved image is higher than a resolution of a image produced from the first data set without image processing; and
   using the improved image of the entire lunar surface to retrieve a global distribution of lunar regolith thickness for lunar exploration activities.

2. The method of claim 1, further comprising: setting, by the computer system, the spacing between control points in the control lattice to be halved from one lattice to the next lattice of the hierarchy of control lattice.

3. The method of claim 1, wherein the TB data from two adjacent times are detected by the lunar probe in two time frames separated at time intervals of one hour.

4. The method of claim 1, wherein the specific frequency is selected from a group consisting of 3.0 GHz, 7.8 GHz, 19.35 GHz and 37 GHz.

5. The method of claim 1, wherein the resolution of the improved image of the lunar surface is 1°×1°, 0.5°×0.5°, 0.25°×0.25° or 0.125°×0.125°.

6. A computer system that process an improved image of an entire lunar surface in brightness temperature (TB) that provides a global distribution of a lunar regolith thickness for lunar exploration activities at a current time, the computer system comprising:
   at least one processor;
   a display; and
   a non-transitory computer-readable medium having stored therein instructions that when executed cause the at least one processor to:
      set, on a passive microwave radiometer of a lunar probe, a time frame sufficient for acquiring TB data of the lunar surface;
      sample, by the passive microwave radiometer of the lunar probe, the TB data of the lunar surface within the time frame at a specific frequency at the current time to form a first data set;
      fill a region of no sampled TB data of the lunar surface at the current time with TB data from two adjacent times to form a second data set;
      generate a complete TB data set (T) for the entire lunar surface by combining the first data set and the second data set;
      produce the improved image of the entire lunar surface from T and that includes:
         set a hierarchy of control lattice $C_0, C_1, \ldots, C_h$, wherein $C_0$ is a coarsest control lattice and $C_h$ is a densest control lattice, $C_k$ is the control lattice at a level k of the hierarchy of control lattice, and a spacing between control points in the control lattice is smaller from one lattice to a next lattice;
         generate an approximation function $f_0$ by applying many-knot (MK) splines approximation to T with $C_0$;
         generate a sequence of approximation function $f_k$ from level k=1 to k=h of the hierarchy of control lattice by applying MK splines approximation to a deviation data set $T_k$ with $C_k$, wherein $T_k$ is produced by calculating a deviation of a sum of functions from $f_0$ to $f_{k-1}$ for each data in T; and generate a final approximation function f by summing $f_0$ and a sequence of an approximation function $f_k$ from level k=1 to k=h to generate an interpolated surface;

produce the improved image from the interpolated surface, wherein a resolution of the improved image is higher than a resolution of a image produced from the first data set without image processing.

7. The computer system of claim 6, wherein the spacing between the control points in the control lattice is halved from one lattice to the next lattice of the hierarchy of control lattice.

8. The computer system of claim 6, wherein the TB data from two adjacent times are detected by the lunar probe in two time frames separated in one hour time intervals.

9. The computer system of claim 6, wherein the resolution of the improved image of the lunar surface is 1°×1°, 0.5°×0.5°, 0.25°×0.25° or 0.125°×0.125°.

10. A method of determining a brightness temperature (TB) of an entire lunar surface at a current time, the method comprising:

setting, on a passive microwave radiometer of a lunar probe, a time frame sufficient for acquiring TB data of the lunar surface;

sampling, by the passive microwave radiometer of the lunar probe, the TB data of the lunar surface within the time frame at a specific frequency at the current time to form a first data set;

filling a region of no sampled TB data of the lunar surface at the current time with TB data from two adjacent times to form a second data set;

generating a complete TB data set (T) for the entire lunar surface by combining the first data set and the second data set;

determining, by a computer system, the brightness temperature of the entire lunar surface from T by:

setting, by the computer system, a hierarchy of control lattice $C_0, C_1, \ldots, C_h$, wherein $C_0$ is a coarsest control lattice and $C_h$ is a densest control lattice, $C_k$ is the control lattice at a level k of the hierarchy of the control lattice, and a spacing between control points in the control lattice is smaller from one lattice to a next lattice;

generating, by the computer system, an approximation function $f_0$ by applying many-knot (MK) splines approximation to T with $C_0$;

generating, by the computer system, a sequence of approximation function $f_k$ from level k=1 to k=h of the hierarchy of control lattice by applying MK splines approximation to a deviation data set $T_k$ with $C_k$, wherein $T_k$ is produced by calculating a deviation of a sum of functions from $f_0$ to $f_{k-1}$ for each data in T; and generating, by the computer system, a final approximation function f by summing $f_0$ and the sequence of approximation function $f_k$ from level k=1 to k=h to produce an interpolated surface;

calculating, by the computer system, brightness temperature of the entire lunar surface from the interpolated surface.

11. The method of claim 10, further comprising: setting, by the computer system, the spacing between control points in the control lattice to be halved from one lattice to the next lattice of the hierarchy of control lattice.

12. The method of claim 10, wherein the TB data from two adjacent times are detected by the lunar probe in two time frames separated at time intervals of one hour.

13. The method of claim 10 further comprising:

producing, by the computer system, an improved image of the lunar surface based on the brightness temperature of the entire lunar surface, wherein the resolution of the improved image of the lunar surface is 1°×1°, 0.5°×0.5, 0.25°×0.25° or 0.125°×0.125°.

* * * * *